(12) United States Patent
Sharma et al.

(10) Patent No.: US 11,469,766 B2
(45) Date of Patent: Oct. 11, 2022

(54) DIGITAL-TO-ANALOG CONVERTERS HAVING MULTIPLE-GATE TRANSISTOR-LIKE STRUCTURE

(71) Applicant: INTEL CORPORATION, Santa Clara, CA (US)

(72) Inventors: Abhishek A. Sharma, Hillsboro, OR (US); Ravi Pillarisetty, Portland, OR (US); Charles Kuo, Hillsboro, OR (US); Willy Rachmady, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 832 days.

(21) Appl. No.: 16/024,052

(22) Filed: Jun. 29, 2018

(65) Prior Publication Data

US 2020/0007135 A1 Jan. 2, 2020

(51) Int. Cl.
*H03M 1/66* (2006.01)
*H03M 1/00* (2006.01)
*H03M 1/74* (2006.01)

(52) U.S. Cl.
CPC .............. *H03M 1/004* (2013.01); *H03M 1/74* (2013.01)

(58) Field of Classification Search
CPC .................................................... H03M 1/004
USPC ....................................................... 341/144
See application file for complete search history.

(56) References Cited

U.S. PATENT DOCUMENTS

| | | | |
|---|---|---|---|
| 10,388,574 B2* | 8/2019 | Kim | H01L 21/823814 |
| 2013/0043511 A1* | 2/2013 | Tsai | H01L 29/66636 |
| | | | 438/300 |
| 2013/0155790 A1* | 6/2013 | Atsumi | G11C 11/4097 |
| | | | 365/189.011 |
| 2015/0001532 A1* | 1/2015 | Yamazaki | H01L 29/42384 |
| | | | 257/43 |
| 2017/0125252 A1* | 5/2017 | Strachan | H01L 29/0634 |
| 2019/0035690 A1* | 1/2019 | Mukherjee | H01L 27/0886 |
| 2020/0027846 A1* | 1/2020 | Chen | H01L 29/735 |

* cited by examiner

*Primary Examiner* — Peguy Jean Pierre
(74) *Attorney, Agent, or Firm* — Schwabe, Williamson & Wyatt P.C.

(57) ABSTRACT

Digital-to-analog converters (DACs) having a multiple-gate (multi-gate) transistor-like structure are disclosed herein. The DAC structures have a similar structure to a transistor (e.g., a MOSFET) and include source and drain regions. However, instead of employing only one gate between the source and drain regions, multiple distinct gates are employed. Each distinct gate can represent a bit for the DAC and can include different gate lengths to enable providing different current values, and thus, unique outputs. Further, N number of inputs can be applied to N number of gates employed by the DAC. The DAC structure may be configured such that the longest gate controls the LSB of the DAC and the shortest gate controls the MSB, or vice versa. In some cases, the multi-gate DAC employs high-injection velocity materials that enable compact design and routing, such as InGaAs, InP, SiGe, and Ge, to provide some examples.

20 Claims, 9 Drawing Sheets

US 11,469,766 B2

DIGITAL-TO-ANALOG CONVERTERS HAVING MULTIPLE-GATE TRANSISTOR-LIKE STRUCTURE

BACKGROUND

A digital-to-analog converter (DAC) is an electronic system that receives a digital signal and converts it to an analog signal. DACs are commonly used for audio and video applications, where digital data needs to be converted to analog signals to allow for output of the desired sound and video. For example, DACs are used in music players to convert digital audio data (e.g., stored as an MP3 file format) into analog audio signals that can be used to drive an audio amplifier, which in turn drives a loudspeaker and thereby produces sound. In video applications, DACs convert digital video data (e.g., stored as an MPEG file format) into analog video signals that connect to screen drivers to display images, such as on a television or computing device (e.g., a smartphone or other personal computing device).

BRIEF DESCRIPTION OF THE DRAWINGS

FIGS. 3B', 3C', 3D', and 3E' illustrate variations to corresponding example structures of FIGS. 3B, 3C, 3D, and 3E that occur when carrying out the method of FIG. 2 using a gate-last process flow, in accordance with some embodiments. The cross-sectional views in FIGS. 3A-3E (as well as FIGS. 4, 4', 5, 5', and 6) are along the body of channel material and perpendicular to the gate lines to illustrate the multiple gates formed for the DAC structures described herein.

FIG. 4' illustrates a cross-sectional view of an example multi-gate DAC structure employing three gates and formed using a gate-last process flow, in accordance with some embodiments.

FIG. 5' illustrates a cross-sectional view of an example multi-gate DAC structure employing two gates and formed using a gate-last process flow, in accordance with some embodiments.

Figure 1:
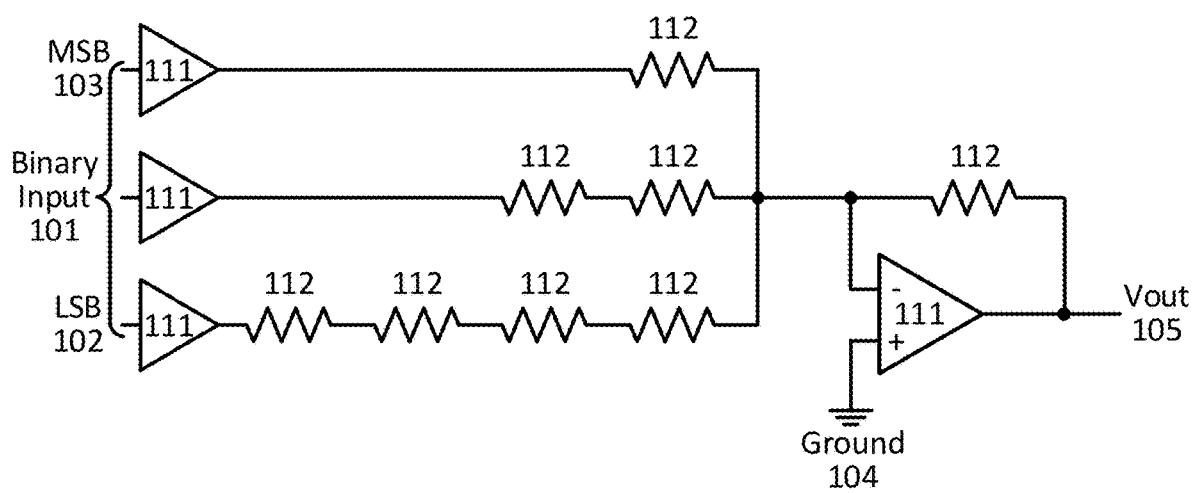
FIG. 1 illustrates an example digital-to-analog (DAC) circuit that includes multiple transistors and resistors.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying distinct features. In short, the figures are provided merely to show example structures.

DETAILED DESCRIPTION

There are numerous digital-to-analog converter (DAC) architectures, as there are various different DAC applications. For instance, FIG. 1 illustrates an example DAC circuit 100 that includes multiple transistors 111 and resistors 112. The DAC circuit 100 receives binary input 101 as shown on the left side of the circuit, and it has a least significant bit (LSB) 102 and a most significant bit (MSB) 103, as well as an intermediate bit therebetween, making circuit 100 a 3-bit DAC. Each bit includes a transistor 111 and one to multiple resistors 112, where each resistor 112 includes the same resistance value. The right side of the circuit 100 includes an amplifier portion that includes another transistor 111 and resistor 112. The connection to ground 104 is indicated as well as the output voltage (Vout) 105 from the DAC circuit 100. DAC circuit 100 operates by receiving the digital signal via binary input 101, routing the signal through the desired bits which causes the signal to route through one or more resistors 112 to produce a resulting current, where that resulting current causes Vout 105 to produce a unique analog output value. DAC circuit 100, along with other DAC circuits, includes multiple transistors and resistors to achieve the desired purpose. However, the inclusion of so many components makes such DAC circuits highly dissipative and power hungry, while also occupying a large area and integrated circuit footprint. Moreover, as the number of bits increase for the DAC circuit, the number of components also increase, thereby exacerbating the aforementioned issues.

Thus, and in accordance with various embodiments of the present disclosure, DACs having a multiple-gate (multi-gate) transistor-like structure are provided herein. As will be apparent in light of this disclosure, the DAC structures described herein include a source region and a drain region, but instead of employing only one gate between the source and drain regions, multiple gates are employed. Accordingly, each gate of the multi-gate transistor-like structure can represent a bit for the DAC and can include different gate lengths to enable providing different current values, and thus, unique outputs (just as DAC circuit 100 can provide different current values and unique outputs). However, the multi-gate transistor-like DAC structures described herein achieve the unique outputs with fewer components and with a relatively large area savings compared to DAC circuit 100 and other DAC circuits that utilize multiple transistors and resistors. Thus, the multi-gate transistor-like DAC structures described herein enable compact transistor design and routing. The DAC structures described herein also provide other benefits compared to DAC circuits that utilize multiple transistors and resistors, such as being less dissipative and consuming lower amounts of power, for example. In addition, in some embodiments, any number of gates (e.g., 2-20) can be utilized in the DAC structures, such that N number of inputs can be applied to the gates, depending on the desired end use or target application.

In some embodiments, the gates of the DAC structure are formed upfront, in a gate-first process flow, where the gate structures all share a common gate dielectric that is between each of the gate electrodes and the body of channel material. In some such embodiments, the common gate dielectric may only be between each gate electrode and the body of channel material, such that the gate dielectric is not on sidewalls of the gate electrodes, for example. In other embodiments, the gates of the DAC structure are formed in a gate-last process flow, where dummy gate structures are employed, source and drain region processing is performed, and then the dummy gates are removed and replaced with final gate structures, where each final gate structure includes its own gate dielectric and gate electrode. In some such embodiments, each gate dielectric may be along sidewalls of each corresponding gate electrode, for example, such that the gate dielectrics each have a U-shape structure in a cross-section along the body of channel material. In some embodiments, the longest gate can be used to control the LSB of the DAC and the shortest gate can be used to control the MSB of the DAC, for example, or conversely, the longest gate can be used to control the MSB of the DAC and the shortest gate can be used to control the LSB. Numerous variations and configurations of the multi-gate DAC structure will be apparent in light of this disclosure.

In some embodiments, the DAC structures described herein include high-injection velocity materials in the channel region of the multi-gate transistor-like structure. As used herein, high-injection velocity materials are materials capable of achieving higher carrier (electron and/or hole) mobility speeds relative to silicon. In some embodiments, the use of high-injection velocity materials to achieve relatively higher transport speeds can help ensure that a sufficient number of carriers can drive through the off-state gates and ungated gaps between the source and drain regions. Thus, in some embodiments, high-injection velocity semiconductor materials may be required in the channel region to ensure proper operation of the DAC structure, especially as a higher number of gates are employed (e.g., at least 3 gates or at least 4 gates). For instance, such high-injection semiconductor materials include, but are not limited to, germanium-based group IV semiconductor materials, such as germanium (Ge) or silicon germanium (SiGe), and some group III-V semiconductor materials, such as gallium arsenide (GaAs), indium gallium arsenide (InGaAs), indium phosphide (InP), indium arsenide (InAs), indium antimonide (InSb), and indium gallium nitride (InGaN), to provide some examples. However, use of silicon for the channel material may be suitable for some embodiments.

As previously described herein, high-injection velocity materials can achieve higher carrier (electron and/or hole) mobility speeds relative to silicon. For instance, silicon (Si) has been measured to be capable of achieving maximum electron mobility of 1400 $cm^2/(V \cdot s)$ at 301 K and maximum hole mobility of 450 $cm^2/(V \cdot s)$ at 301 K. In the aforementioned units of mobility, note that 'cm' stands for centimeters, 'V' stands for volts, 's' stands for seconds, and 'K' stands for kelvins. However, Ge has been measured to achieve a maximum electron mobility of 3900 $cm^2/(V \cdot s)$ at 301 K and a maximum hole mobility of 1900 $cm^2/(V \cdot s)$ at 301 K. In some embodiments, even higher electron mobility values can be achieved using group III-V semiconductor materials for the channel of the DAC structures, such as maximums (in values of $cm^2/(V \cdot s)$ at 301 K) of 4000 for InAs, 5400 for InP, 8500 for GaAs, and 77000 for InSb. In some embodiments, it is desired to employ channel material that can achieve maximum carrier (electron or hole) mobilities of at least 1500, 2000, 2500, 3010, 4000, 5000, 7500, or 10000 $cm^2/(V \cdot s)$ at 301 K, depending on the configuration of the multi-gate DAC structure (e.g., depending on the number and/or widths of the gates employed). In some embodiments, even higher mobilities can be obtained by adding strain to the semiconductor material included in the body of channel material. The added strain can be either tensile or compressive (e.g., tensile strain may be desired for an n-type channel where electrons are the carriers and compressive strain may be desired for a p-type channel where holes are the carriers). Further, the added strain can be caused by material engineering, such as by forming the body of channel material on semiconductor material that causes strain based on the lattice parameters of the two materials and/or by forming the source/drain regions in a manner that applies strain to the body of channel material. In some embodiments, the added strain can desirably improve carrier mobility by 5-70% or more, for example.

In some embodiments, the DAC structures described herein are formed such that the carriers are electrons (e.g., n-type DAC structures, where the source and drain regions include n-type dopant), while in other embodiments, the DAC structures are formed such that the carriers are holes (e.g., p-type DAC structures, where the source and drain regions include p-type dopant). In some embodiments, it is desired to form the DAC structures to be n-type, due to the relatively higher electron mobilities that are achievable in the channel material compared to hole mobilities. Again, it may be desirable to use such relatively high-mobility materials when using higher numbers of gates in the multi-gate DAC structure (e.g., at least 3 gates or at least 4 gates), to ensure that a suitable quantity of carriers (e.g., electrons or holes) can flow through portions of the channel that have off-state gates or are ungated, in accordance with some embodiments. For instance, in an embodiment employing a four gate DAC structure, if only the first gate is on, then the resulting '1000' configuration would need to be detected, which would require an adequate number of carriers to flow through the second, third, and fourth off-state gates, as well as through the ungated portions between the gates. Even where no gates are on, such as in a '0000' state with four gates, it may be desired to configure the DAC structure to have some amount of leakage to ensure detection of that '0000' state, or at least to ensure detection of the state where only the smallest gate is on, such as a '0001' state, for example.

In some embodiments, to ensure that a suitable number of carriers can flow between the source and drain regions, gates and/or inter-gate spaces with relatively small lengths/widths can be employed to minimize the overall distance between the source and drain regions. For instance, in some embodiments, the total length/width of the body of channel material between the source and drain regions is in the range of 20 to 500 nanometers (nm), which is a vast area and IC footprint savings compared to multiple transistor and resistor DAC structures (e.g., DAC circuit 100 in FIG. 1), that typically require similar feature lengths of 1 to 20 micrometers (microns). Further, the multi-gate DAC structures described herein require less components and features than multiple transistor and resistor DAC structures (e.g., DAC circuit 100 in FIG. 1), which not only provides area savings, but can also provide cost and materials savings, as well as decreasing fabrication complexity. Further still, the compact design of the multi-gate DAC structures described herein can provide back-end-of-line benefits by way of easier and less interconnections to the device. Numerous other benefits of the techniques and structures described herein will be apparent in light of this disclosure.

Note that, as used herein, the expression "X includes at least one of A or B" refers to an X that includes, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that includes just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that is included, for example, in just A only, in just B only, or in both A and B. The above discussion with respect to "X includes at least one of A or B" equally applies here, as will be appreciated. Moreover, this is true for any number of items.

Note that the use of "source/drain" or "S/D" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein can be detected using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools can indicate an integrated circuit including a multi-gate DAC structure as variously described herein. For instance, the structures may be detected by taking a cross-section of an integrated circuit along the body of channel material to observe multiple distinct gate structures (e.g., multiple gate electrodes) at least above and over that body of channel material and between given source and drain regions, such that there is no other source or drain region between the given source and drain regions. Further, the body of channel material would be continuous, monolithic, and unbroken between the given source and drain regions, as the channel region extends between the source and drain regions to allow for the transport of carriers under the multiple gate structures. In some embodiments, the techniques described herein can be detected based on the structures formed therefrom. In addition, in some embodiments, the techniques and structures described herein can be detected based on the benefits derived therefrom. Numerous configurations and variations will be apparent in light of this disclosure.

Architecture and Methodology

Figure 2:
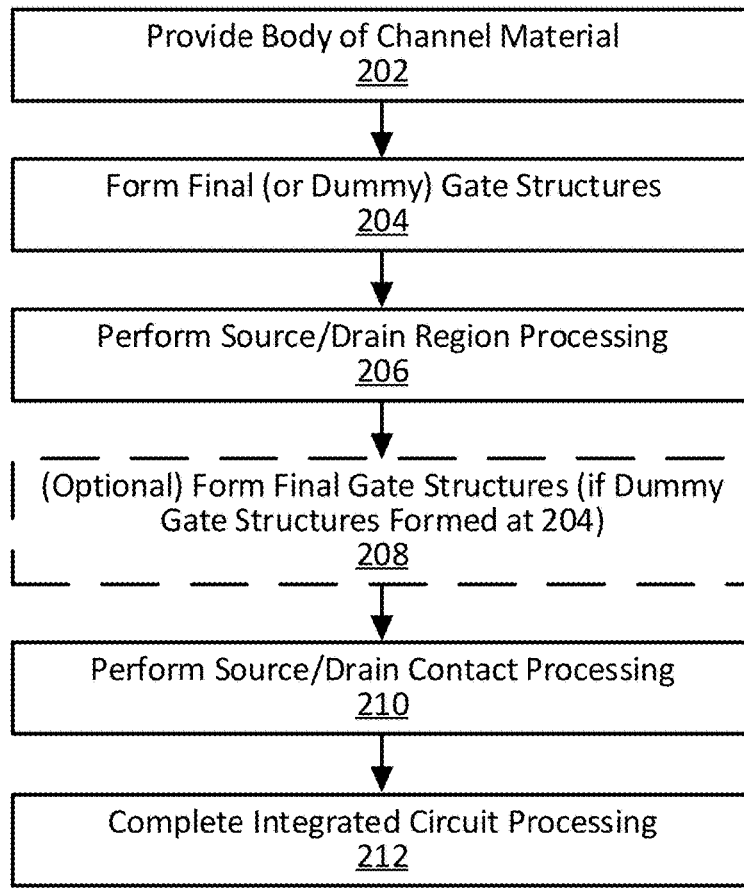
FIG. 2 illustrates a method of forming an integrated circuit (IC) including at least one multi-gate DAC structure, in accordance with some embodiments.
Figure 4:
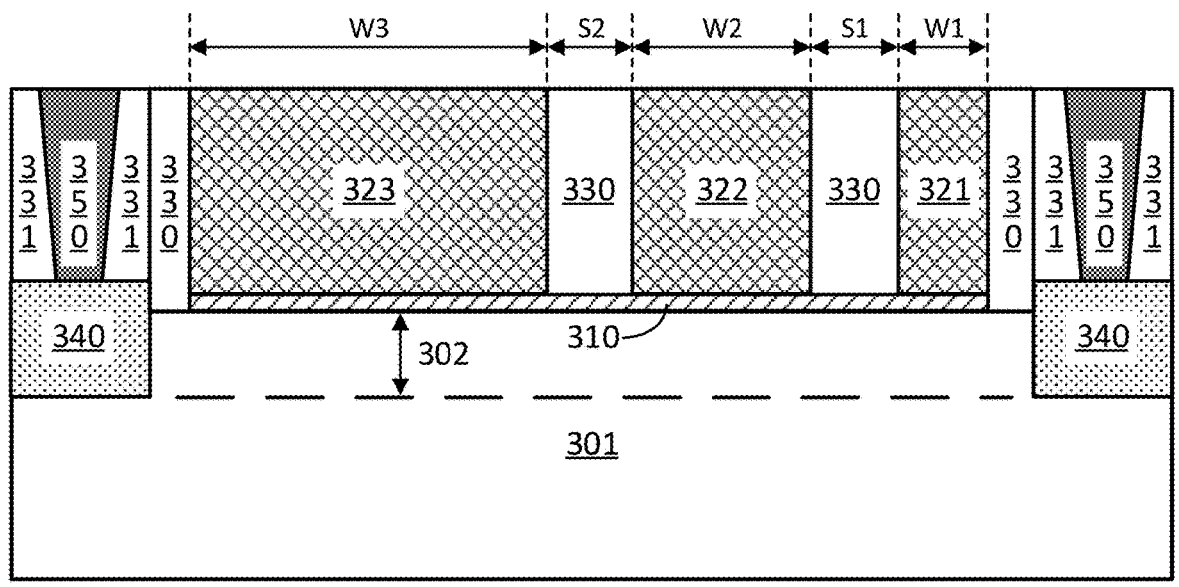
FIG. 4 illustrates a cross-sectional view of an example multi-gate DAC structure employing three gates and formed using a gate-first process flow, in accordance with some embodiments.
Figure 4:
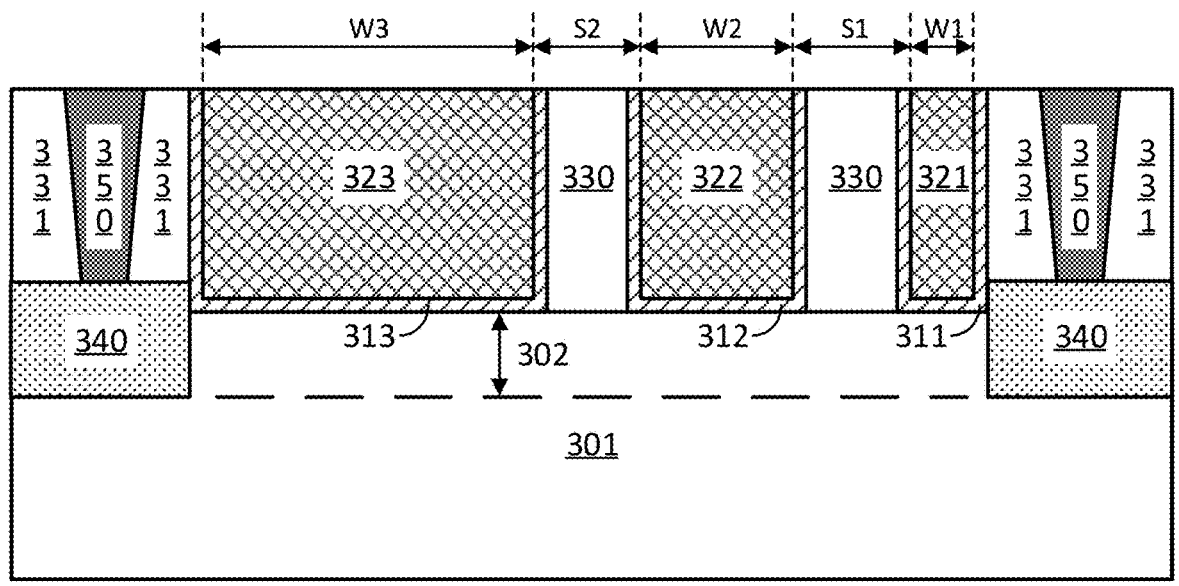
Figure 5:
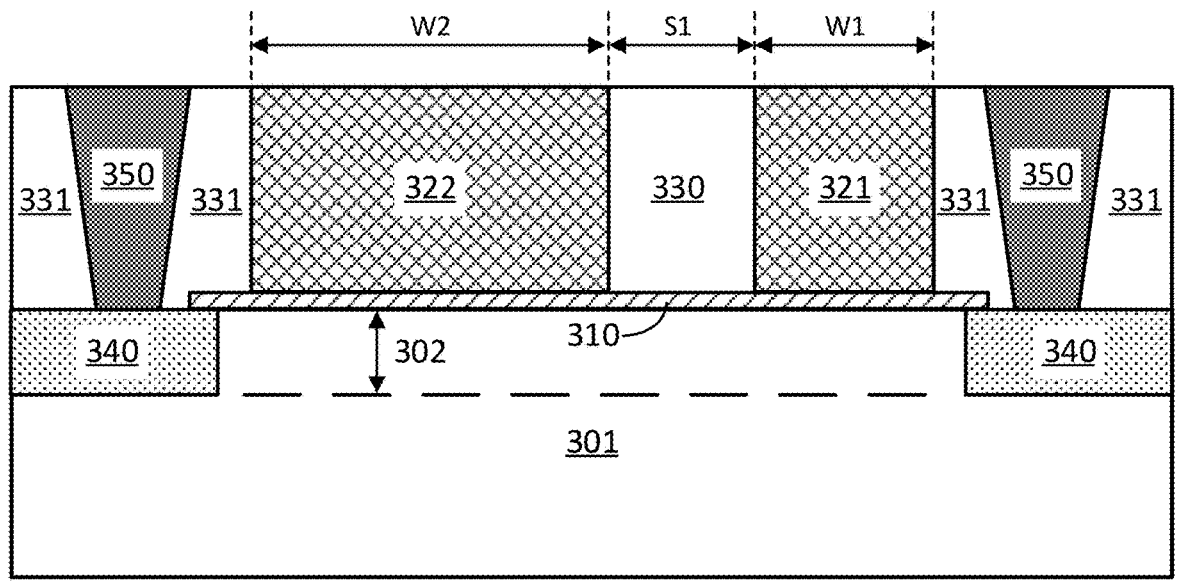
FIG. 5 illustrates a cross-sectional view of an example multi-gate DAC structure employing two gates and formed using a gate-first process flow, in accordance with some embodiments.
Figure 5:
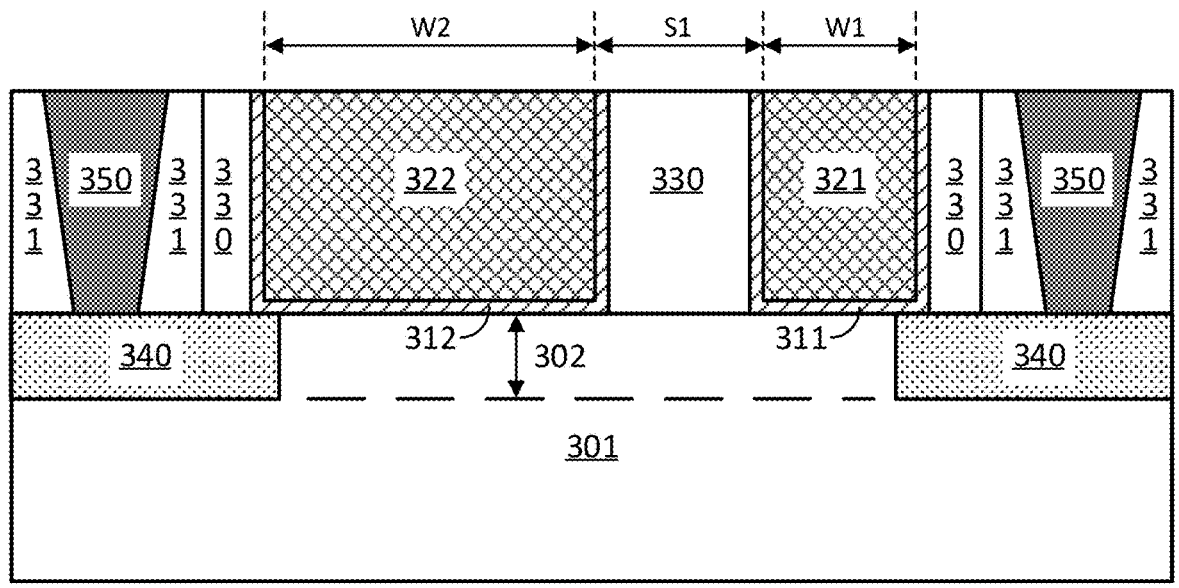

FIG. 2 illustrates method 200 of forming an integrated circuit (IC) including at least one multi-gate DAC structure, in accordance with some embodiments. FIGS. 3A-3E illustrate cross-sectional views of example IC structures formed when carrying out method 200 of FIG. 2 using a gate-first process flow, such that the final gate structures are formed at 204 and optional process 208 is not performed, in accordance with some embodiments. FIGS. 3B', 3C', 3D', and 3E' illustrate variations to corresponding example structures of FIGS. 3B, 3C, 3D, and 3E that occur when carrying out method 200 of FIG. 2 using a gate-last process flow, such that a dummy gate is employed at 204 and optional process 208 is performed, in accordance with some embodiments. The cross-sectional views in FIGS. 3A-3E (as well as FIGS. 4, 4', 5, 5', and 6) are along the body of channel material and perpendicular to the gate lines to illustrate the multiple gates formed for the DAC structures described herein. The multi-gate DAC structures that are formed in the embodiments illustrated in FIGS. 3A-3E include four gates. However, any number of gates may be formed, as will be apparent in light of this disclosure, and the present disclosure is not intended to be limited to a specific number of gates unless otherwise expressly stated. For instance, the DAC structures can be formed with three gates, such as is shown in FIGS. 4 and 4', or with two gates, such as is shown in FIGS. 5 and 5', in accordance with some embodiments. In general, 2-16 or more distinct gates (with distinct gate electrodes) may be employed, in accordance with some embodiments.

Note that deposition or epitaxial growth techniques (or more generally, additive processing) where described herein can use any suitable techniques, such as chemical vapor deposition (CVD), physical vapor deposition (PVD), atomic layer deposition (ALD), and/or molecular beam epitaxy (MBE), to provide some examples. Also note that etching techniques (or more generally, subtractive processing) where described herein can use any suitable techniques, such as wet and/or dry etch processing which may be isotropic (e.g., uniform etch rate in all directions) or anisotropic (e.g., etch rates that are orientation dependent), and which may be non-selective (e.g., etches all exposed materials at the same or similar rates) or selective (e.g., etches different materials that are exposed at different rates). Further note that other processing may be used to form the DAC structures and integrated circuits described herein as will be apparent in light of this disclosure, such as hardmasking, patterning or lithography (via suitable lithography techniques, such as, e.g., photolithography, extreme ultraviolet lithography, x-ray lithography, or electron beam lithography), planarizing or polishing (e.g., via chemical-mechanical planarization (CMP) processing), doping (e.g., via ion implantation, diffusion, or including dopant in the base material during formation), and annealing, to name some examples.

Figure 3A:
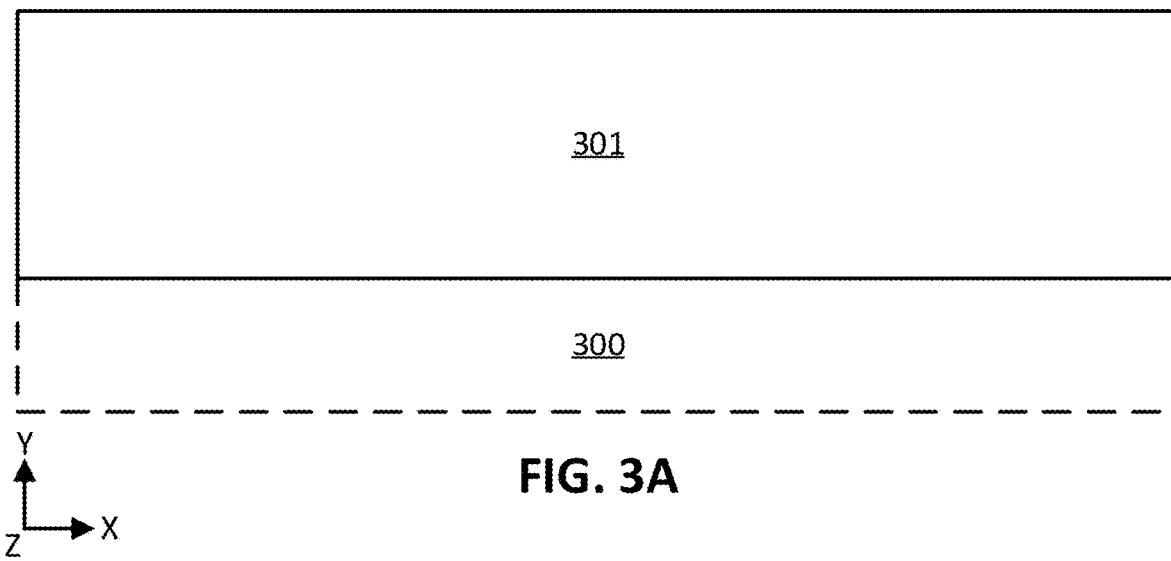
FIGS. 3A-3E illustrate cross-sectional views of example IC structures formed when carrying out the method of FIG. 2 using a gate-first process flow, in accordance with some embodiments. Note that FIG. 3E illustrates an example multi-gate DAC structure employing four gates.
Figure 3B:
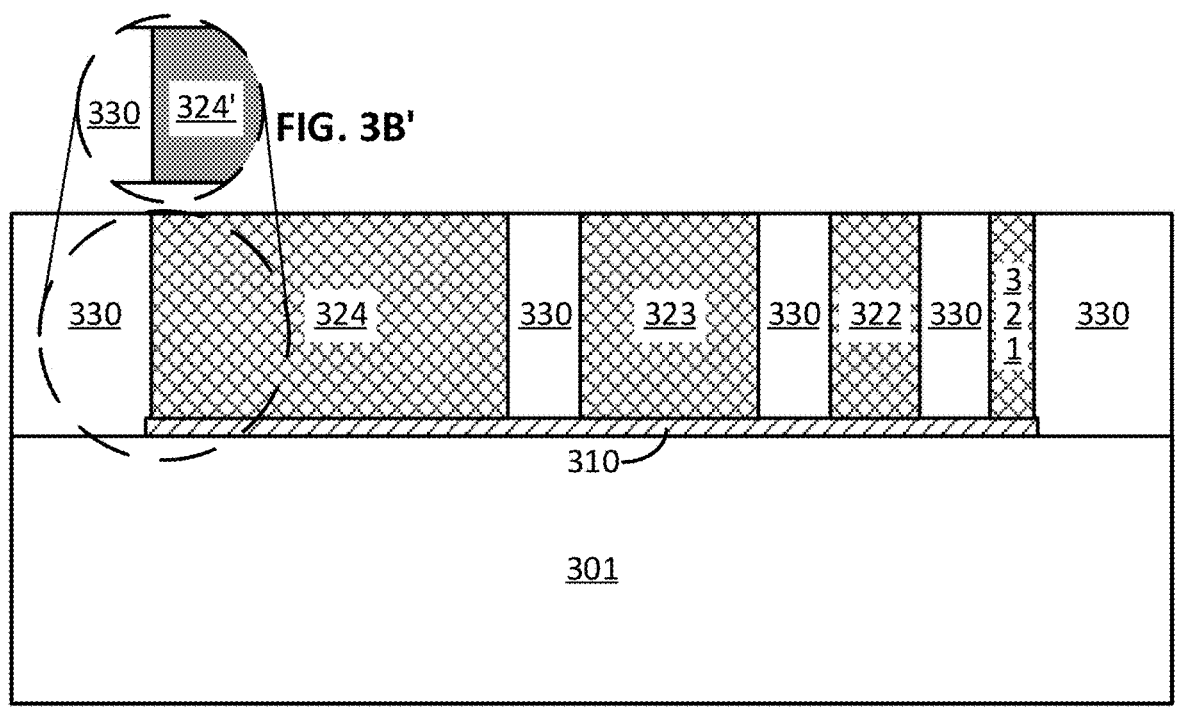

Method 200 of FIG. 2 includes providing 202 a body of channel material, such as providing the example body of channel material 301 shown in FIG. 3A, in accordance with some embodiments. Note that body of channel material 301 may be referred to as simply body 301 herein for ease of description. In some embodiments, body 301 is native to and a part of a substrate used for the integrated circuit, while in other embodiments, body 301 includes different material formed above and/or directly on the integrated circuit substrate. Thus, in some embodiments, an optional substrate 300 may be at least below body 301. Note that optional substrate 300 is shown as having a lesser thickness (direction in the Y-axis direction) than body 301, but in some cases, substrate 300, where present, would be much thicker than body 301 (e.g., where substrate has a thickness of at least 1 micron). Regardless, the substrate that supports the DAC structure can be any suitable substrate, such as: a bulk substrate including group IV semiconductor material, such as silicon (Si), germanium (Ge), silicon germanium (SiGe), or silicon carbide (SiC), group III-V semiconductor material, and/or any other suitable material as will be apparent in light of this disclosure; an X on insulator (XOI) structure where X is one of the aforementioned semiconductor materials and the insulator material is an oxide material or dielectric material, such that the XOI structure includes the electrically insulating material layer between two semiconductor layers; or some other suitable multilayer structure where the top layer includes semiconductor material to be used for body 301. In some embodiments, the substrate can be an insulator or dielectric substrate, such as a glass substrate. In some such embodiments, the semiconductor material for body 301 can be transferred to that insulator or dielectric substrate to maintain a desired quality. For ease of discussion, it may be assumed that the structures described herein are formed above (and in some cases, directly on) a bulk silicon substrate.

Note that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth. Also note that group III may also be known as the boron group or IUPAC group 13, group IV may also be known as the carbon group or IUPAC group 14, and group V may also be known as the nitrogen group or IUPAC group 15, for example.

In embodiments where semiconductor material described herein includes dopant, the dopant is any suitable n-type and/or p-type dopant that is known to be used for the specific semiconductor material. For instance, in the case of group IV semiconductor materials (e.g., Si, SiGe, Ge), p-type dopant includes group III atoms (e.g., boron, gallium, aluminum), and n-type dopant includes group V atoms (e.g., phosphorous, arsenic, antimony). In the case of group III-V semiconductor materials (e.g., GaAs, InGaAs, InP, GaP), p-type dopant includes group II atoms (e.g., beryllium, zinc, cadmium), and n-type dopant includes group VI atoms (e.g., selenium, tellurium). However, for group III-V semiconductor materials, group VI atoms (e.g., silicon, germanium) can be employed for either p-type or n-type dopant, depending on the conditions (e.g., formation temperatures). In embodiments where dopant is included in semiconductor material, the dopant can be included at quantities in the range of 1E16 to 1E22 atoms per cubic cm, or higher, for example. In some embodiments, dopant is included in semiconductor material in a quantity of at least 1E16, 1E17, 1E18, 5E18, 1E19, 5E19, 1E20, 5E20, or 1E21 atoms per cubic cm and/or of at most 1E22, 5E21, 1E21, 5E20, 1E20, 5E19, 1E19, 5E18, or 1E18 atoms per cubic cm, for example. In some embodiments, semiconductor material described herein is undoped/intrinsic, or includes relatively minimal dopant, such as a dopant concentration of less than 1E16 atoms per cubic cm, for example. For instance, in embodiments where optional distinct substrate 300 is present and includes semiconductor material, that semiconductor material may be either undoped/intrinsic or it may include dopant. Note that semiconductor material described herein has a monocrystalline or single-crystal structure (also referred to as a crystalline structure) unless otherwise explicitly stated (e.g., unless referred to as having a polycrystalline or amorphous structure).

As previously described herein, in some embodiments, the body 301 is merely a top portion of a substrate that may or may not be formed into a desired shape (e.g., a fin) using patterning and/or lithography techniques, for example. However, in other embodiments, the body 301 includes material that is different from and not native to the material of an underlying substrate where present (e.g., where optional substrate 300 is present). For instance, in some embodiments, body 301 can be formed by blanket depositing (on at least a portion of substrate 300) a layer of the channel material and then patterning that layer of channel material into body 301, for example. In another embodiment, body 301 can be formed in insulator material trenches, which can be formed by forming the top of the substrate into fins, forming the insulator around the fins, and then recessing or removing the fins via etching to form the trenches, for example. In some such embodiments, the insulator material is recessed to expose more of the body of replacement material (e.g., which may be shaped like fins for non-planar configurations), while in other embodiments, the insulator material is not recessed (e.g., for planar configurations). In some embodiments, a multilayer stack is formed either by blanket deposition or by forming the stack in the insulator trenches to enable the subsequent formation of gate-all-around configurations, for example, where some of the layers in the stack are sacrificial and intended to be removed via selective etching to release the one or more bodies of channel material, as will be described in more detail herein.

Regardless of whether body 301 is or is not native to the integrated circuit substrate, in some embodiments, the integrated circuit substrate is used for one or more other devices, such as various diodes (e.g., light-emitting diodes (LEDs) or laser diodes), various transistors (e.g., MOSFETs, TFETs), various capacitors (e.g., MOSCAPs), various microelectromechanical systems (MEMS), various nanoelectromechanical systems (NEMS), various radio frequency (RF) devices, various sensors, and/or any other suitable semiconductor or IC devices, depending on the end use or target application. Accordingly, in some embodiments, the structures described herein are included in system-on-chip (SoC) applications.

In some embodiments, the body of channel material 301 includes semiconductor material. In some embodiments, body 301 includes group IV and/or group III-V semiconductor material. In some embodiments, semiconductor material included in body 301 also includes dopant (with corresponding n-type and/or p-type dopant), while in other embodiments, semiconductor material included in body 301 is undoped/intrinsic. In some embodiments, body 301 includes high-injection semiconductor materials that include relatively higher electron and/or hole maximum mobility speeds relative to silicon. For instance, such high-injection velocity materials include, but are not limited to, germanium-based group IV semiconductor materials, such as germanium (Ge) or silicon germanium (SiGe), and some group III-V semiconductor materials, such as gallium arsenide (GaAs), indium gallium arsenide (InGaAs), indium phosphide (InP), indium arsenide (InAs), indium antimonide (InSb), and/or indium gallium nitride (InGaN), to provide some examples. In some embodiments, body 301 includes strain, either in the form of tensile strain or compressive strain. In some such embodiments, the strain is throughout the entirety of body 301, while in other embodiments, the strain is only in one or more portions of body 301 (such as the outer portions nearest the source/drain regions 340). In some cases, strain is introduced into body 301 to help ensure carriers can traverse the entirety of body 301, even when only the smallest/narrowest gate is in an on-state (and all other gates of the multi-gate structure are in an off-state).

Thus, in some embodiments, body 301 includes one or more of germanium, silicon, tin, indium, gallium, aluminum, arsenic, phosphorous, or nitrogen. For instance, in some embodiments, body 301 includes germanium. In some such embodiments where body 301 includes germanium, the germanium concentration may be in the range of 30 to 100 atomic percent. Further, in some such embodiments where body 301 includes germanium, the body may also include silicon and/or tin. In another example embodiment, body 301 includes indium, such as in a group III-V semiconductor compound of indium arsenide (InAs), indium gallium arsenide (InGaAs), indium phosphide (InP), or indium gallium nitride (InGaN), to provide some example compounds. In another example embodiment, body 301 includes gallium, such as in a group III-V semiconductor compound of gallium arsenide (GaAs), indium gallium arsenide (InGaAs), indium gallium nitride (InGaN), or gallium antimonide (GaSb), to provide some example compounds. However, in some embodiments, the body 301 includes or essentially consists of silicon (whether doped or undoped), which may be suitable for embodiments that employ three gates or less, for example.

In some embodiments, the body 301 is used for a planar configuration, where the channel of the DAC structure primarily resides near the top surface of the body 301, such as where the multiple gate structures described herein are formed only on the top surface of the body 301. In other embodiments, the body 301 is used for non-planar configurations, where the channel of the DAC structure resides near multiple sides of the body 301. For instance, in some non-planar embodiments, the body 301 is a fin or includes a fin-like shape, where the fin body is between portions of the gate structures of the multi-gate DAC. Such configurations may be referred to as having a finFET structure, as the structure resembles a finned MOSFET structure, but with multiple gates between corresponding source and drain regions to achieve the DAC functionality. In some non-planar embodiments, a gate-all-around configuration is employed where the gate structures are around the body 301, such that the body 301 is a nanowire or nanoribbon, for example. Non-planar configurations are described in more detail with reference to FIGS. 6 and 7. Note that the figures and accompanying description provided herein generally apply to both planar and non-planar configurations, unless explicitly stated otherwise.

Method 200 of FIG. 2 continues with forming 204 final (or dummy) gate structures on the body 301 of channel material, such as to form the example resulting structure of FIG. 3B, in accordance with some embodiments. The gate structures or gate stacks in the example structure of FIG. 3B are shown as final gate structures that will be in the final integrated circuit structure, and include gate dielectric 310 and gate electrodes 321-324. In such embodiments, the processing includes a gate-first flow (also called up-front hi-k gate processing), where a final gate structure is formed prior to performing the source and drain region processing. Alternatively, in some embodiments, dummy gate structures are initially formed at 204 in a gate-last flow (also called a replacement gate or replacement metal gate (RMG) process). For instance, FIG. 3B' is a blown-out portion of FIG. 3B illustrating the alternative gate-last processing, which includes forming dummy gate structures at 204 instead of final gate structures, in accordance with some embodiments. As shown in FIG. 3B', dummy gate structure 324' was formed instead of the final gate structure, in accordance with some embodiments. The dummy gate structure 324', where employed, may include a dummy gate dielectric (e.g., dummy oxide material) and a dummy gate electrode (e.g., dummy poly-silicon material) to be used for the replacement gate process, where those dummy materials are intended to be sacrificial such that they can be later removed and replaced by a final gate structure.

Figure 3C:
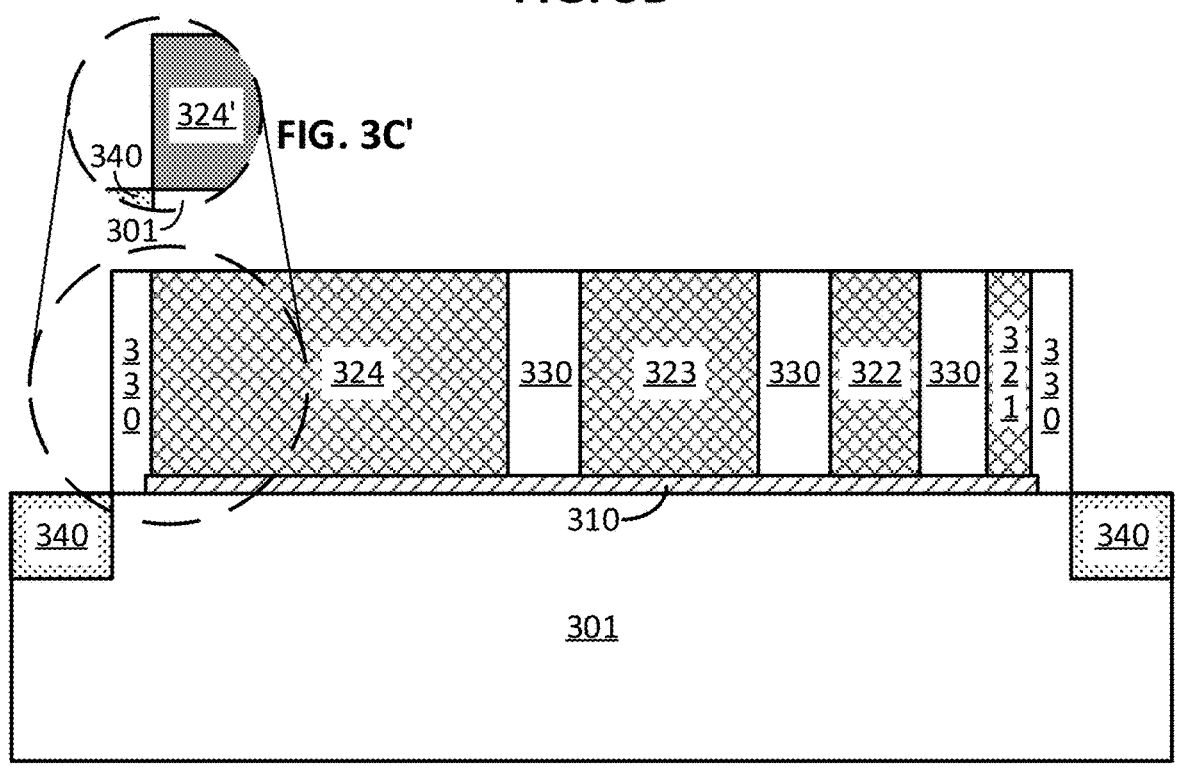
Figure 3D:
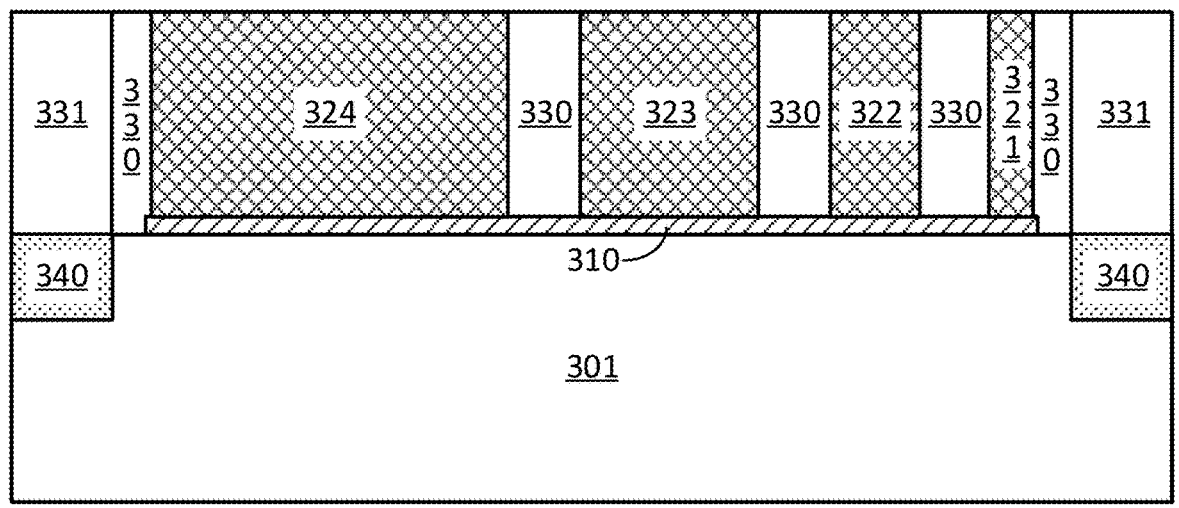
Figure 3D:
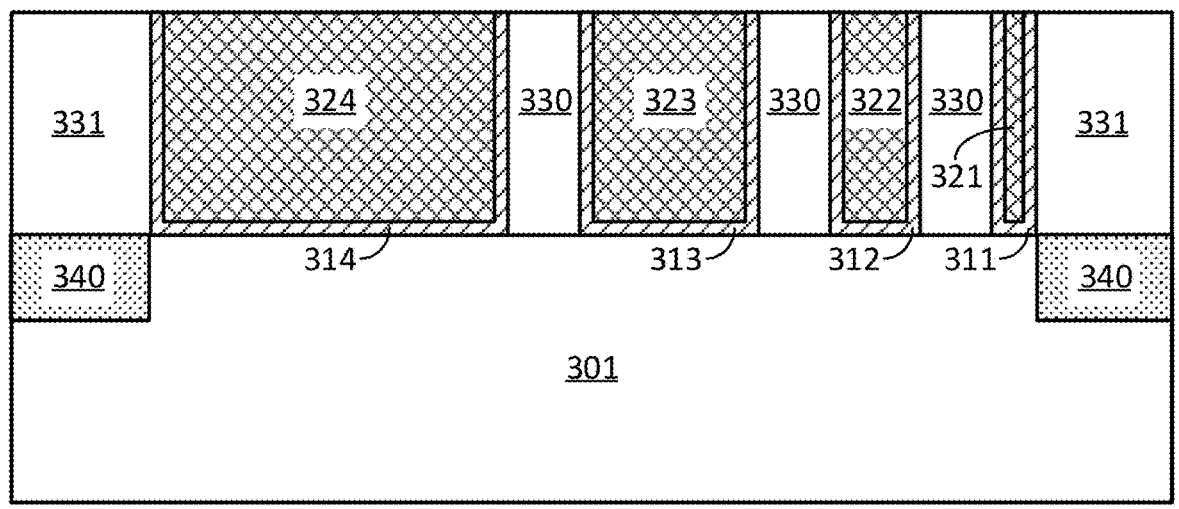
Figure 3E:
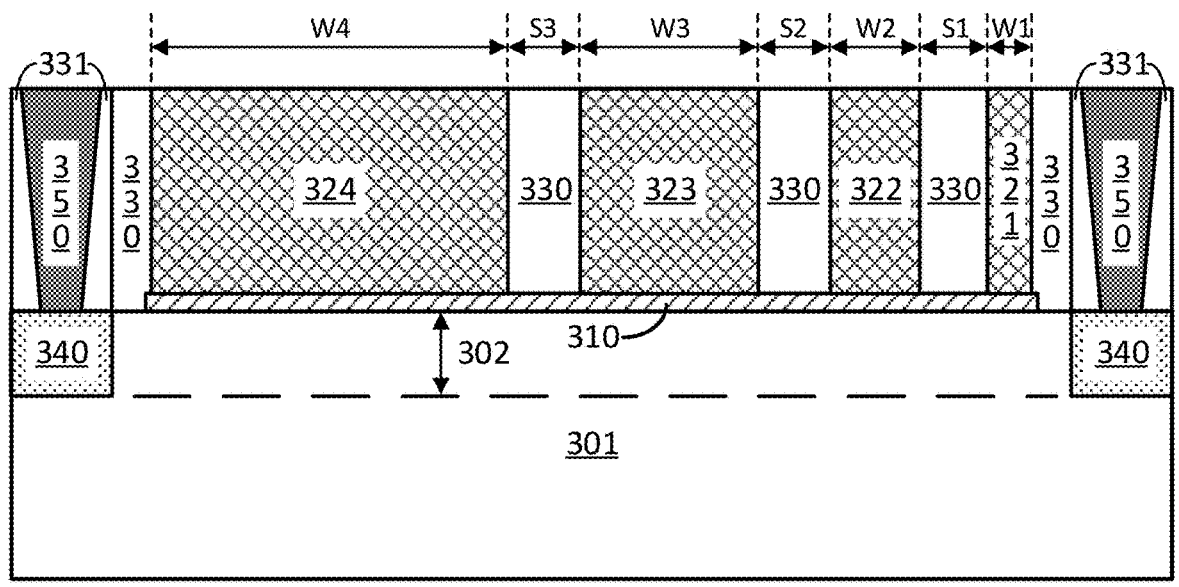
Figure 3E:
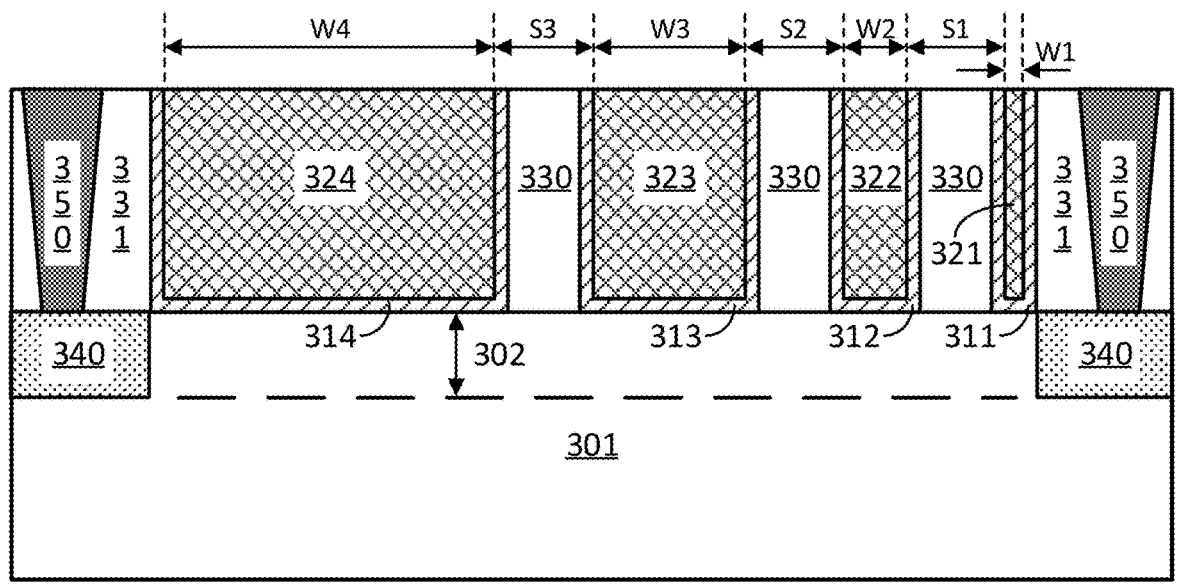

Regardless of whether the final gate structures are formed using a gate-first or a gate-last process flow, they include gate dielectrics that include indicators in the 310s in the figures (e.g., 310 in the example structure of FIG. 3E, and 311-314 in the example structure of FIG. 3E') and gate electrodes that include indicators in the 320s in the figures (e.g., 321, 322, 323, and 324 in the example structures of FIGS. 3E and 3E'). In some embodiments, the gate structures, whether final or dummy, are formed by blanket depositing the final or dummy gate materials and then patterning the materials to the desired gate structures. In some embodiments, the gate structures, whether final or dummy, are formed by first forming dielectric layer 330, etching trenches in dielectric layer 330, and then forming the gate structures in the trenches. In some embodiments, gate dielectric 310 is formed prior to forming dielectric layer 330. For instance, this may be achieved by masking off areas where the gate dielectric 310 is not to be formed and then depositing the gate dielectric 310 on body 301. In other cases, it may be achieved by blanket depositing the gate dielectric 310 and then patterning it to the desired shape (such as the shape shown in FIG. 3B). In some embodiments, selective subtractive etching is employed to form the gate electrodes, such as gate electrodes 321-324 shown in FIG. 3B. In some such embodiments, the selective subtractive etching may include masking off a subset of final gate electrode locations, forming one or more of the final gate structures in the non-masked areas (e.g., via removal of a portion of dielectric layer 330 to form a trench into which the final gate electrode material can be formed), and then repeating the masking and final gate electrode formation processing to form the desired number of final gate structures. For instance, using the structure of FIG. 3B, gate electrodes 321 and 323 may have been formed in a first round of masking and forming, and then gate electrodes 322 and 324 could then be formed in a second round of masking and forming, or vice versa, to provide some examples. In any such embodiments, the processing may include planarizing and/or polishing (e.g., via CMP) the structure to form the planar top surface shown in FIG. 3B.

In some embodiments, gate dielectric 310 (or one or more of gate dielectrics 311, 312, 313, and 314, or simply 311-314) includes an oxide (e.g., silicon dioxide), nitride (e.g., silicon nitride), high-k dielectric, low-k dielectric, and/or any other suitable material as will be apparent in light of this disclosure. Examples of high-k dielectrics include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. Examples of low-k dielectrics include, for instance, fluorine-doped silicon dioxide, carbon-doped silicon dioxide, porous silicon dioxide, porous carbon-doped silicon dioxide, spin-on organic polymeric dielectrics (e.g., polytetrafluoroethylene, benzocyclobutene, polynorbornenes, polyimide), spin-on silicon based polymeric dielectrics (e.g., hydrogen silsesquioxane, methylsilsesquioxane), to provide some examples. In some embodiments, an annealing process is carried out on a gate dielectric to improve its quality when, for example, high-k dielectric material is employed.

In some embodiments, a gate dielectric includes oxygen. In some such embodiments where a gate dielectric includes oxygen, the gate dielectric also includes one or more other materials, such as one or more of hafnium, silicon, lanthanum, aluminum, zirconium, tantalum, titanium, barium, strontium, yttrium, lead, scandium, tantalum, zinc, lithium, or niobium. For instance, a gate dielectric may include hafnium and oxygen (e.g., in the form of hafnium oxide or hafnium silicon oxide), or a gate dielectric may include silicon and oxygen (e.g., in the form of silicon dioxide, hafnium silicon oxide, or zirconium silicon oxide), in accordance with some embodiments. In some embodiments, a gate dielectric includes nitrogen. In some such embodiments where a gate dielectric includes nitrogen, the gate dielectric may also include one or more other materials, such as silicon (e.g., silicon nitride) for instance. In some embodiments, a gate dielectric includes silicon and oxygen, such as in the form of one or more silicates (e.g., titanium silicate, tungsten silicate, niobium silicate, and silicates of other transition metals). In some embodiments, a gate dielectric includes oxygen and nitrogen (e.g., silicon oxynitride or aluminum oxynitride).

In some embodiments, a gate dielectric includes a multilayer structure, including two or more compositionally distinct layers. For example, a multilayer gate dielectric can be employed to obtain desired electrical isolation and/or to help transition from the body 301 to one or more gate electrodes (e.g., gate electrode 321), in accordance with some embodiments. In an example embodiment, a multilayer gate dielectric has a first layer nearest the body 301 that includes oxygen and one or more materials included in the body (such as silicon and/or germanium), which may be in the form of an oxide (e.g., silicon dioxide or germanium oxide), and the multilayer gate dielectric also has a second layer farthest from the body 301 (and nearest the corresponding gate electrode) that includes at least one high-k dielectric (e.g., hafnium and oxygen, which may be in the form of hafnium oxide or hafnium silicon oxide). In some embodiments where a multilayer gate dielectric is employed, the structure includes a first sub-layer that is only between the corresponding gate electrode and the body 301, and a second sub-layer that is both between the corresponding gate electrode and the body 301 as well as along sidewalls of the gate electrode. This may be achieved via replacement gate processing, where a final gate dielectric is formed along sidewalls of dielectric material after the dummy gate structure is removed. In some embodiments, a gate dielectric includes grading (e.g., increasing and/or decreasing) the content/concentration of one or more materials through at least a portion of the gate dielectric, such as the oxygen content/concentration within the gate dielectric.

In some embodiments, gate dielectric 310 (or one or more of gate dielectrics 311-314) has a thickness in the range of 1-30 nm (or in a sub-range of 1-5, 1-10, 1-15, 1-20, 1-25, 2-5, 2-10, 2-15, 2-20, 2-25, 2-30, 3-8, 3-12, 5-10, 5-15, 5-20, 5-25, 5-30, 10-20, 10-30, or 20-30 nm) or greater, for example, or within any other suitable range or having any other suitable value as will be apparent in light of this disclosure. In some embodiments, the thickness of a gate dielectric is at least 1, 2, 3, 5, 10, 15, 20, or 25 nm, and/or at most 30, 25, 20, 15, 10, 8, or 5 nm, for example. Note that the thicknesses described herein for a gate dielectric relate at least to the dimension between the body 301 and a corresponding gate electrode, such as one of gate electrodes 321-324. For instance, in the structure of FIG. 3B, the thickness of gate dielectric 310 would be at least the dimension in the Y-axis direction between body 301 and a corresponding gate electrode (such as one of gate electrodes 321, 322, 323, or 324). In some embodiments, the thickness of a gate dielectric is selected, at least in part, based on the desired amount of isolation between body 301 and a corresponding gate electrode.

In some embodiments, a gate dielectric provides means for insulating a gate electrode from body 301. In some embodiments, the characteristics of a gate dielectric are selected based on desired electrical properties. For instance, some embodiments employ a relatively thicker gate dielectric (e.g., at least 5 or 10 nm in thickness) and/or relatively lower-k dielectric material for a gate dielectric, such as silicon dioxide or low-k dielectric material (where the dielectric constant, k, is less than that of silicon dioxide, so less than 3.9) to help reduce parasitic capacitance issues caused between adjacent gate electrodes or between gate electrodes and adjacent source/drain contacts, for example. However, in other embodiments, hi-k dielectric material is desired as such material can provide desired electrical properties for some gate configurations. Recall that all relevant description with respect to gate dielectric 310 provided herein is equally applicable to gate dielectrics 311, 312, 313, and 314, and vice versa.

In some embodiments, gate electrodes 321, 322, 323, and 324 (or simply 321-324) include one or more metals, such as one or more of aluminum, tungsten, titanium, tantalum, copper, nickel, gold, platinum, ruthenium, or cobalt, for example. In some embodiments, one or more of the gate electrodes include carbon and/or nitrogen, such as in combination with one or more of the aforementioned metals, for example. For instance, in some embodiments one or more of the gate electrodes include titanium and nitrogen (e.g., titanium nitride), or tantalum and nitrogen (e.g., tantalum nitride), such as in a liner layer that is in direct contact with the gate dielectric, for example. Thus, in some embodiments, one or more of the gate electrodes include one or more metals that may or may not include one or more other materials (such as carbon and/or nitrogen). In some embodiments, one or more of the gate electrodes include a multilayer structure, including two or more compositionally distinct layers. For instance, in some such embodiments, one or more work function layers are employed, such as one or more metal-including layers that are formed with desired electrical characteristics. Further, in some such embodiments, the one or more metal-including layers include tantalum and/or titanium, which may also include nitrogen (e.g., in the form of tantalum nitride or titanium nitride). In some embodiments, a bulk metal structure is formed on and between a conformal layer (such as a liner layer), where the bulk metal structure includes compositionally distinct material from the conformal/liner layer. In some such embodiments, the conformal/liner layer would be "U" shaped, for example.

In some embodiments, one or more of the gate electrodes 321-324 include a resistance reducing metal layer between a bulk metal structure and the gate dielectric, for instance. Example resistance reducing metals include, for instance one or more of nickel, titanium, titanium with nitrogen (e.g., titanium nitride), tantalum, tantalum with nitrogen (e.g., tantalum nitride), cobalt, gold, gold with germanium (e.g., gold-germanium), nickel, platinum, nickel with platinum (e.g., nickel-platinum), aluminum, and/or nickel with aluminum (e.g., nickel aluminum), for instance. Example bulk metal structures include one or more of aluminum, tungsten, ruthenium, copper, or cobalt, for instance. In some embodiments, one or more of the gate electrodes 321-324 include additional layers, such as one or more layers including titanium and nitrogen (e.g., titanium nitride) and/or tantalum and nitrogen (e.g., tantalum nitride), which can be used for adhesion and/or liner/barrier purposes, for example. In some embodiments, the thickness, material, and/or deposition process of sub-layers within a multilayer gate electrode are selected based on a target application, such as whether a gate electrode is to be used with an n-type body of channel material 301 or a p-type body of channel material 301. In some embodiments, the one or more gate electrodes provide means for changing the electrical attributes of the adjacent body of channel material 301 when a voltage is applied to those one or more gate electrodes.

In some embodiments, one or more of the gate electrodes 321-324 have a thickness in the range of 10-100 nm (or in a sub-range of 10-25, 10-50, 10-75, 20-30, 20-50, 20-75, 20-100, 30-50, 30-75, 30-100, 50-75, or 50-100 nm) or greater, for example, or within any other suitable range or having any other suitable value as will be apparent in light of this disclosure. In some embodiments, one or more of the gate electrode thicknesses falls within the sub-range of 20-40 nm. In some embodiments, the thickness of one or more gate electrodes is at least 10, 15, 20, 25, 30, 40, or 50 nm and/or at most 100, 50, 40, 30, 25, or 20 nm, for example. Note that the thicknesses described herein for the gate electrodes relate at least to the dimension perpendicular to the length of body 301. For instance, in the structure of FIG. 3B, the thickness of gate electrodes 321-324 would be at least the dimension in the Y-axis direction, which may also be referred to as the height of the gate electrodes 321-324. In some embodiments, one or more gate electrodes include grading (e.g., increasing and/or decreasing) the content/concentration of one or more materials through at least a portion of the structure.

Although there are 4 gate electrodes (321-324) illustrated in FIGS. 3E and 3E', the present disclosure is not intended to be limited to exactly four gate electrodes unless otherwise explicitly stated. In other embodiments, a multi-gate DAC structure as described herein can have exactly 2, 3, 5, 6, 7, 8, 9, 10, 11, 12, 13, 14, 15, 16, or more gate electrodes. For instance, the multi-gate DAC structures of FIGS. 4 and 4' include exactly 3 gate electrodes, in accordance with some embodiments. Further, the multi-gate DAC structures of FIGS. 5 and 5' include exactly 2 gate electrodes, in accordance with some embodiments. In addition, in some embodiments, a multi-gate DAC structure includes 2 gate electrodes such that it has 2 or more, includes 3 gate electrodes such that it has 3 or more, includes 4 gate electrodes such that it has 4 or more, and so forth. Thus, the relevant description herein with respect to the four gate DAC structures of FIGS. 3E and 3E' is equally applicable to multi-gate DAC structures including any other number of N gate electrodes. In some embodiments, the number of gate electrodes is selected based on the desired number of bits for the DAC structure (as each gate electrode can be used as a distinct bit). In other words, N number of inputs can be applied to N number of gates.

In some embodiments, dielectric layer 330 includes any suitable oxide (e.g., silicon dioxide), nitride (e.g., silicon nitride), high-k dielectric, low-k dielectric, and/or any other suitable electrically insulating material as will be apparent in light of this disclosure. In some embodiments, dielectric layer 330 includes silicon, oxygen, nitrogen, and/or carbon. For instance, in some embodiments, dielectric layer 330 includes silicon dioxide, silicon nitride, silicon oxynitride, or carbon-doped silicon dioxide (or other carbon-doped oxides). In some embodiments, it is desired to select material for dielectric layer 330 that has a low dielectric constant and a high breakdown voltage. In some embodiments, to decrease dielectric constant, the dielectric layer 330 is formed to be intentionally porous, such as including at least one porous carbon-doped oxide (e.g., porous carbon-doped silicon dioxide). In embodiments where dielectric layer 330 is porous, it includes a plurality of pores throughout at least a portion of the layer. In some embodiments, dielectric layer 330 includes a multilayer structure, even though it is illustrated as a single layer in the example structure of FIG. 3B. In some embodiments, dielectric layer 330 and gate dielectric 310 do not include a distinct interface as shown in FIG. 3B, particularly where dielectric layer 330 and gate dielectric 310 include the same material, for example. Note that dielectric layer 330 may be referred to as an interlayer dielectric (ILD) structure, in some cases.

Method 200 of FIG. 2 continues with performing 206 source and drain region processing, such as to form the example resulting structure of FIG. 3C that includes source and drain regions 340, in accordance with some embodiments. Note that the source region and the drain region are referred to herein as simply source/drain regions 340 for ease of description, as either of the regions 340 may be the source region thereby making the other region 340 the drain region. In other words, how the DAC structure is electrically connected and/or how it operates can dictate which region 340 is the source region and which is the drain region. For instance, in some embodiments, the left source/drain region 340 in the structure of FIG. 3C is the source region and the right source/drain region 340 is the drain region, and vice versa in other embodiments (left region 340 is the drain and right region 340 is the source). In some embodiments, the source/drain regions 340 can be formed using any suitable techniques. For instance, in some embodiments, dielectric layer 330 is etched to remove at least a portion of the layer and to expose body 301, such as is shown in FIG. 3C. Then, the source/drain regions 340 can be formed by introducing dopant into the semiconductor material of body 301 at the locations shown (e.g., via diffusion and/or implantation), or by removing a portion of the material of body 301 and replacing it with replacement semiconductor material that also includes dopant, or by cladding the exposed semiconductor material of body 301 with the source/drain material, or by some other suitable method as can be understood based on this disclosure.

In some embodiments, source/drain regions 340 include semiconductor material. In some embodiments, source/drain regions 340 include group IV and/or group III-V semiconductor material. In some embodiments, source/drain regions 340 include one or more of silicon, germanium, tin, indium, gallium, aluminum, arsenic, nitrogen, phosphorous, arsenic, or antimony. For instance, in an example embodiment, source/drain regions 340 include germanium (e.g., in a concentration in the range of 1-100 atomic percent), which may or may not also include silicon (e.g., in the form of Ge or SiGe). In another example embodiment, source/drain regions 340 include gallium and arsenic, which may or may not also include indium (e.g., in the form of GaAs or InGaAs). In some embodiments, the source/drain regions 340 include the same semiconductor material (e.g., where they are processed simultaneously), while in other embodiments, the source/drain regions 340 include compositionally distinct semiconductor material (e.g., where they are processed separately using masking techniques). Further, in some embodiments, the semiconductor material included in source/drain regions includes dopant, such as n-type and/or p-type dopant. For instance, in some embodiments, both of the source/drain regions 340 include n-type dopant (e.g., for an n-type device where electrons are the carriers between the source and drain regions 340). In other embodiments, both of the source/drain regions 340 include p-type dopant (e.g., for a p-type device where holes are the carriers between the source and drain regions 340). In still other embodiments, one of the source/drain regions 340 includes n-type dopant, while the other of the source/drain regions 340 includes p-type dopant, such as in a configuration that employs quantum tunneling.

In some embodiments, one or both of source/drain regions 340 include a multilayer structure that includes at least two compositionally distinct material layers or portions. For instance, in some such embodiments employing a multilayer source/drain region, there may be a first portion nearest body 301 and a second portion nearest source/drain contact structure 350, where the first and second portions include compositionally distinct materials. For example, the second portion may include a relatively higher amount of dopant than the second portion, which may help prevent diffusion of undesired dopant into the body 301 and/or help reduce contact resistance. In another example, the first portion includes a first semiconductor material and the second portion includes a second semiconductor material different form the first semiconductor material. For instance, the first portion may include Si or SiGe with a relatively low Ge concentration (e.g., 0-30 atomic percent), while the second portion may include SiGe or Ge with a relatively high Ge concentration (e.g., 30-100 atomic percent). In some embodiments, one or both of source/drain regions 340 include grading (e.g., increasing and/or decreasing) of the concentration of one or more materials within the feature. For example, the atomic percent concentration of a semiconductor compound can be graded or changed throughout at least a portion of a source/drain region 340, such as the concentration of Ge or In in the region. In another example, the concentration of dopant is graded in a source/drain region 340, such as having the concentration be relatively lower near body 301 and relatively higher near the corresponding source/drain contact structure 350. This can be achieved by tuning the amount of dopant in the reactant flow (e.g., during an in-situ doping scheme), for example. Further, such a graded configuration can help prevent diffusion of undesired dopant into the body 301 and/or help reduce contact resistance, for example.

FIG. 3C' illustrates forming a source/drain region 340 during a gate-last process flow, in accordance with some embodiments. As shown in FIG. 3C', dielectric layer 330 was completely removed to the side of dummy gate structure 324' prior to forming source/drain region 340. This can allow for the. However, the present disclosure is not intended to be so limited, as the source/drain regions 340 can be formed in various ways and have various configurations. For instance, in some embodiments, source/drain regions 340 do not extend under the gate dielectric 310, such as is shown in FIG. 3C. In other embodiments, source/drain regions 340 do extend under an adjacent gate dielectric, and in some instances, are in direct contact with the adjacent gate dielectric, such as is shown in FIGS. 5 and 5'. In some embodiments, source/drain regions 340 are raised, such that a top surface of source/drain regions 340 is above the bottom-most surface of an adjacent gate dielectric, and in some instances, are above the bottom-most surface of an adjacent gate electrode, such as is shown in FIGS. 4 and 4'. After source/drain processing 206 is performed, an additional dielectric layer 331 is formed over the source/drain regions 340, in some embodiments, such as is shown in FIGS. 3D and 3D'. The relevant description herein with respect to dielectric layer 330 (such as regarding formation and materials) is equally applicable to additional dielectric layer 331. In some embodiments, additional dielectric layer 331 includes the same dielectric material as dielectric layer 330, while in other embodiments, additional dielectric layer 331 includes compositionally distinct material relative to dielectric layer 330.

Method 200 of FIG. 2 continues with optionally forming 208 the final gate structures if dummy gate structures were employed in a gate-last process flow, in accordance with some embodiments. For instance, FIG. 3D' illustrates that the dummy gate structures (such as dummy gate structure 324' shown in FIGS. 3B' and 3C') were removed and replaced with final gate structures, in the example structure. The final gate structures include four gate electrodes 321, 322, 323, and 324, which is the same as the gate-first process flow resulting in the example structure of FIG. 3D, in these embodiments. However, as the gate-last process flow structure of FIG. 3D' forms the final gate dielectric structures in dielectric trenches (between portions of dielectric layer 330 and additional dielectric layer 331) after the removal of the dummy gate structures, in some embodiments, the final gate dielectric structures 311, 312, 313, and 314 are not only formed on the bottom of those trenches, but also on the sidewalls of those trenches, as shown. Thus, in some embodiments, the gate dielectrics have a "U" shape such as is shown in FIG. 3D'. The relevant description herein with respect to gate dielectric 310 (such as regarding formation, materials, and dimensions) is equally applicable to gate dielectrics 311-314.

Method 200 of FIG. 2 continues with performing 210 source/drain contact processing, such as to form the example resulting structures of FIGS. 3E and 3E' that include source/drain contact structures 350, in accordance with some embodiments. Note that the source contact structure and the drain contact structure may simply be referred to herein as source/drain contact structures 350 for ease of description, as either of the contact structures 350 may be to the source region thereby making the other contact structure 350 to the drain region. In other words, in some embodiments, the left source/drain region 340 is the source region and thus corresponding contact structure 350 would be the source contact structure, making the right source/drain region 340 the drain region and thus corresponding contact structure 350 would be the drain contact structure, while in other embodiments, the opposite configuration applies, with the source on the right and the drain on the left. In some embodiments, the source/drain contact structures 350 can be formed using any suitable techniques.

In some embodiments, source/drain contact processing 210 includes forming contact trenches in additional dielectric layer 331 (over the respective source/drain regions 340) and then forming the source/drain contact structures 350 in the trenches. In some embodiments, the source/drain contact processing 210 includes silicidation, germanidation, and/or III-V-idation to form a mixture of one or more metals with the exposed semiconductor material surface of the source/drain regions 340. In some cases, the mixture of the metal and semiconductor material is referred to as an intermetallic region. In some embodiments, one or both of the source/drain contact structures 350 include a resistance reducing metal and a contact plug metal, or just a contact plug, for instance. Example contact resistance reducing metals include, for instance, nickel, titanium, titanium with nitrogen (e.g., in the form of titanium nitride), tantalum, tantalum with nitrogen (e.g., in the form of tantalum nitride), cobalt, gold, gold-germanium, nickel-platinum, nickel aluminum, and/or other such resistance reducing metals or alloys. Example contact plug metals include, for instance, aluminum, tungsten, ruthenium, or cobalt, although any suitable conductive material could be employed. In some embodiments, additional layers are present in the source/drain contact trenches, where such additional layers would be a part of the source/drain contact structures 350. Examples of additional layers include adhesion layers and/or liner/barrier layers, that include, for example, titanium, titanium with nitrogen (e.g., in the form of titanium nitride), tantalum, and/or tantalum with nitrogen (e.g., in the form of tantalum nitride). Another example of an additional layer is a contact resistance reducing layer between a given source/drain region 340 and its corresponding source/drain contact structure 350, where the contact resistance reducing layer includes semiconductor material and relatively high dopant (e.g., with dopant concentrations greater than 1E19, 1E20, 1E21, 5E21, or 1E22 atoms per cubic cm), for example.

As shown in FIGS. 3E and 3E', the four gate electrodes 321, 322, 323, and 324 have widths (or lengths) indicated as W1, W2, W3, and W4, respectively. In addition, the spaces between adjacent gate electrodes are indicated as S1 (between first gate electrode 321 and second gate electrode 322), S2 (between second gate electrode 322 and third gate electrode 323), and S3 (between third gate electrode 323 and fourth gate electrode 324). In FIGS. 4 and 4', the DAC structures employ exactly three gate electrodes 321, 322, and 323 having widths (or lengths) W1, W2, and W3, respectively, as well as respective spaces S1 and S2. In FIGS. 5 and 5', the DAC structures employ exactly two gate electrodes 321 and 322 having widths (or lengths) W1 and W2, respectively, as well as respective space S1. As can be understood, the present disclosure can apply to any number of N exact gate electrodes employed in a multi-gate DAC structure, where the gate electrodes include respective widths W1 . . . WN, and include respective spaces between adjacent gate electrodes. Note that both the gate electrode widths (e.g., W1-W4) and spaces (e.g., S1-S3) therebetween relate at least to the dimension in the X-axis direction as shown. In some embodiments, the gate electrode widths (e.g., W1-W4) and spaces (e.g., S1-S3) therebetween relate to a value at a given location (e.g., at the bottom of the feature, halfway up the feature, at the top of the feature) and/or to a maximum value.

In some embodiments, one or more of the gate electrodes have a width (e.g., one or more of W1-W4) in the range of 5-500 nm (or in a sub-range of 5-10, 5-25, 5-50, 5-100, 5-250, 10-25, 10-50, 10-100, 10-250, 10-500, 25-50, 25-100, 25-250, 25-500, 50-100, 50-250, 50-500, 100-250, 100-500, or 250-500 nm), or greater, for example, or within any other suitable range or having any other suitable value as will be apparent in light of this disclosure. In some embodiments, the width of a given gate electrode (e.g., one or more of W1-W4) is at least 5, 8, 10, 15, 25, 50, 75, 100, 200, 250, 300, or 400 nm, and/or at most 500, 400, 300, 250, 200, 100, 75, 50, 25, 15, 10, or 8 nm, for example. In some embodiments, it is desired to employ relatively small gate electrode widths as possible to, for example, decrease the overall size/footprint of the DAC structure, such as employing a smallest gate electrode width (e.g., W1) of less than 20 nm or less than 15 nm (e.g., a smallest gate electrode width of 10 nm or 8-12 nm) and/or a largest gate electrode width (e.g., W4, in embodiments employing exactly four gate electrodes) of less than 200 nm or less than 100 nm. Further, relatively small gate electrode widths can be employed to ensure that the carriers (electrons or holes) can effectively travel through the body of channel material 301 between the source/drain regions 340 to ensure that current can be detected where only the smallest width gate electrode is in an on-state (and the other gates are in an off-state), for example. In some embodiments, the gate electrode with the greatest width of all the gate electrodes in the multi-gate DAC structure (e.g., the widest or longest gate) controls the least significant bit (LSB) of the DAC, while the gate electrode with the smallest width of all the gate electrodes in the multi-gate DAC structure (e.g., the narrowest or shortest gate) controls the most significant bit (MSB) of the DAC. In such an embodiment, using the example DAC structures of FIGS. 3E and 3E', gate electrode 324 would control the LSB and gate electrode 321 would control the MSB, for example. In other embodiments, the opposite configuration is employed, where the widest gate electrode controls the MSB and the narrowest gate electrode controls the LSB.

In some embodiments, the widths of the gate electrodes (e.g., one or more of W1-W4) are selected based on the desired electrical properties of the DAC structure. For instance, in some embodiments, the gate electrodes increase in width by approximately double (e.g., within 5, 3, or 2 nm of exactly double) going from one source/drain region 340 to the other source/drain region 340 (e.g., from source to drain or drain to source). Such a configuration can be employed for linearity purposes for the DAC operation, where the associated current values will also be desirably linear (or approximately linear), for example. For instance, in such an embodiment, using the example structures of FIGS. 3E and 3E', W2 would be approximately 2 times W1, W3 would be approximately 2 times W2 (and approximately 4 times W1), and W4 would be approximately 2 times W3 (and approximately 8 times W4), where approximately is within (plus/minus) 5, 3, or 2 nm of the exact values. To provide a specific example, if W1 is 10 nm and the other gate electrodes approximately double in width where approximately is within 3 nm, then W2 would be 17-23 nm, W3 would be 37-43 nm, and W4 would be 77-83 nm. In some embodiments, the width of one gate electrode of a multi-gate DAC structure is at least 5, 10, 15 or 20 nm greater than the width of an adjacent gate electrode. In some such embodiments, the differences in gate electrode widths can provide unique current values for the on-state of those differing width gate electrodes, thereby allowing for unique corresponding output values, which is desirable for at least DAC applications, for example. To provide a specific example, if W1 is 15 nm and the adjacent gate electrode (which would be 322) has a width W2 that is at least 10 nm greater than W1, then W2 would be at least 25 nm. In some embodiments, the widths of at least two gate electrodes of a multi-gate DAC structure are the same or similar (e.g., within 1, 2, or 3 nm).

For a DAC structure including exactly three gate electrodes, such as is shown in FIGS. 4 and 4', W2 would be approximately 2 times W1 and W3 would be approximately 2 times W2 (and approximately 4 times W1). For instance, comparing such DAC structures to the DAC circuit 100 of FIG. 1, where each includes 3 bits, it can be seen that the three-gate DAC structures of FIGS. 4 and 4' achieve the linearity achieved in the DAC circuit 100 of FIG. 1 by employing gate electrode widths (W1-W3) that approximately double going from one source/drain region 340 to the other source/drain region 340. Thus, the doubling of the gate electrode widths in such DAC structures achieves the same or similar linearity that doubling the number of resistors 112 in DAC circuit 100 of FIG. 1 achieves, but with far fewer components and in a much smaller integrated circuit footprint. Moreover, each gate electrode (or bit) in the multi-gate DAC structures described herein does not require its own transistor device (compared to DAC circuit 100 of FIG. 1, where each bit requires a separate transistor 111), which also provides desirable savings with respect to included components and integrated circuit footprint. For a DAC structure including exactly two gate electrodes, such as the DAC structures of FIGS. 5 and 5', W2 would be approximately 2 times W1, and so forth for any exact number of N gate electrodes, where widths approximately double from W1 to W2 to . . . WN.

In some embodiments, the space or distance between two adjacent gate electrodes (e.g., one or more of S1-S3) is in the range of 1-50 nm (or in a sub-range of 1-5, 1-10, 1-15, 1-20, 1-25, 2-5, 2-8, 2-10, 2-12, 2-15, 2-20, 2-50, 3-5, 3-8, 3-10, 3-12, 3-15, 3-50, 5-10, 5-15, 5-25, 5-50, 10- 25, 10-50, or 25-50 nm), or greater, for example, or within any other suitable range or having any other suitable value as will be apparent in light of this disclosure. In some embodiments, the width of a given space or distance between two adjacent gate electrodes (e.g., one or more of S1-S3) is at least 1, 2, 3, 5, 8, 10, 12, 15, 20, or 25 nm and/or at most 50, 40, 30, 25, 20, 15, 12, 10, 8, or 5 nm, for example. In some embodiments it is desired to employ as small of spaces between adjacent gate electrodes as possible to, for example, decrease the overall size/footprint of the DAC structure, such as employing spaces between adjacent gate electrodes of at most 10 or 5 nm. Further, relatively small spaces between adjacent gate electrodes can be employed to ensure that the carriers (electrons or holes) can effectively travel through the body of channel material 301 between the source/drain regions 340 to ensure that current can be detected where only the smallest width gate electrode is in an on-state (and the other gates are in an off-state), for example. In some embodiments, all spaces between adjacent gate electrodes have approximately the same width or distance such that they are all within (plus/minus) 5, 3, or 2 nm of the same value. For instance, to provide an example using the four gate DAC structures of FIGS. 3E and 3E', it may be desired to form all of S1, S2, and S3 to be 5 nm plus/minus 2 nm, such that the resulting spaces S1-S3 are 4 nm, 5 nm, and 3 nm, respectively, for example. As shown in the example structure of FIG. 3E, dielectric layer 330 occupies all of the spaces S1-S3 between adjacent gate electrodes, while in the example structure of FIG. 3E', dielectric layer 330 and portions of corresponding gate dielectrics occupy the spaces S1-S3 between adjacent gate electrodes. However, in both structures, dielectric material occupies the entirety of the spaces S1-S3. In other embodiments, additional layers are present in spaces S1-S3, such as other dielectric layers.

Method 200 of FIG. 2 continues with completing 212 integrated circuit processing, as desired, in accordance with some embodiments. Such additional processing to complete the integrated circuit can include back-end or back-end-of-line (BEOL) processing to form one or more metallization layers and/or to interconnect the devices formed during the front-end or front-end-of-line (FEOL) processing, such as the multi-gate DAC structures described herein. Note that the processes 202-212 of method 200 are shown in a particular order for ease of description, in accordance with some embodiments. However, one or more of the processes 202-212 can be performed in a different order or need not be performed at all, in other embodiments. For example, box 208 is an optional process that need not be performed when employing a gate-first process flow. Numerous variations on method 200 and the techniques described herein will be apparent in light of this disclosure.

FIG. 4 illustrates a cross-sectional view of an example multi-gate DAC structure employing three gates and formed using a gate-first process flow, in accordance with some embodiments. FIG. 4' illustrates a cross-sectional view of an example multi-gate DAC structure employing three gates and formed using a gate-last process flow, in accordance with some embodiments. Understandably, these structures are similar to the structures of FIGS. 3E and 3E', respectively, except that three gates are employed instead of four. In addition, the structures of FIGS. 4 and 4' include source/drain regions 340 that are raised such that a top surface of the source/drain regions 340 is above the top surface of body 301 and also above the bottom surface of the gate dielectric structures (310 or 311-313). Thus, in some embodiments, a source/drain region 340 can be raised in such a manner. For instance, raised source/drain regions 340 may be a result of replacement source/drain processing, where a portion of body 301 is removed and replaced with the final source/drain material, thereby forming the raised source/drain regions 340, for example. The source/drain regions 340 can also be raised in embodiments that employ cladding in the source/drain regions.

FIG. 5 illustrates a cross-sectional view of an example multi-gate DAC structure employing two gates and formed using a gate-first process flow, in accordance with some embodiments. FIG. 5' illustrates a cross-sectional view of an example multi-gate DAC structure employing two gates and formed using a gate-last process flow, in accordance with some embodiments. Understandably, these structures are similar to the structures of FIGS. 3E and 3E', respectively (as well as the structures of FIGS. 4 and 4', respectively), except that two gates are employed instead of four (or three). In addition, the structures of FIGS. 5 and 5' include source/drain regions 340 that extend under the adjacent gate dielectric structure(s) (310 or 311/312). Thus, in some embodiments, a source/drain region 340 can extend in such a manner. Further, the source/drain regions 340 are in direct contact with the adjacent gate dielectric structure (s) (310 or 311/312) as shown. Thus, in some embodiments, a source/drain region 340 can be in direct contact with an adjacent gate dielectric. For instance, such extended source/drain regions 340 that may or may not be in direct contact with a gate dielectric can be formed as a result of the source/drain trench etch undercutting the gate dielectric (e.g., during replacement source/drain processing) and/or due to dopant from the source/drain regions 340 diffusing into the adjacent body 301 thereby extending the source/drain regions 340. In addition, FIG. 5 illustrates that in some embodiments, gate dielectric 310 extends past the outer edge of one or both of the outer-most gate electrodes (which are gate electrodes 321 and 322, in this example case).

Further still, FIG. 5 also illustrates that in some gate-first embodiments, there may be only one dielectric layer between one or both of the outer-most gate electrodes (which are gate electrodes 321 and 322, in this example case) and the adjacent source/drain contact structure 350. This is illustrated in FIG. 5 by only additional dielectric layer 331 being at those locations, such that dielectric layer 330 is absent at those locations (e.g., compare to the structures of FIGS. 3E and 4, where dielectric layer 330 is also present). Alternatively, FIG. 5' also illustrates that in some gate-last embodiments, there may be multiple dielectric layers between one or both of the outer-most gate electrodes (which are gate electrodes 321 and 322, in this example case) and the adjacent source/drain contact structure 350. This is illustrated in FIG. 5' by both dielectric layer 330 and additional dielectric layer 331 being at those locations (e.g., compare to the structures of FIGS. 3E' and 4', where only additional dielectric layer 331 is present).

Non-Planar Configurations

Figure 6:
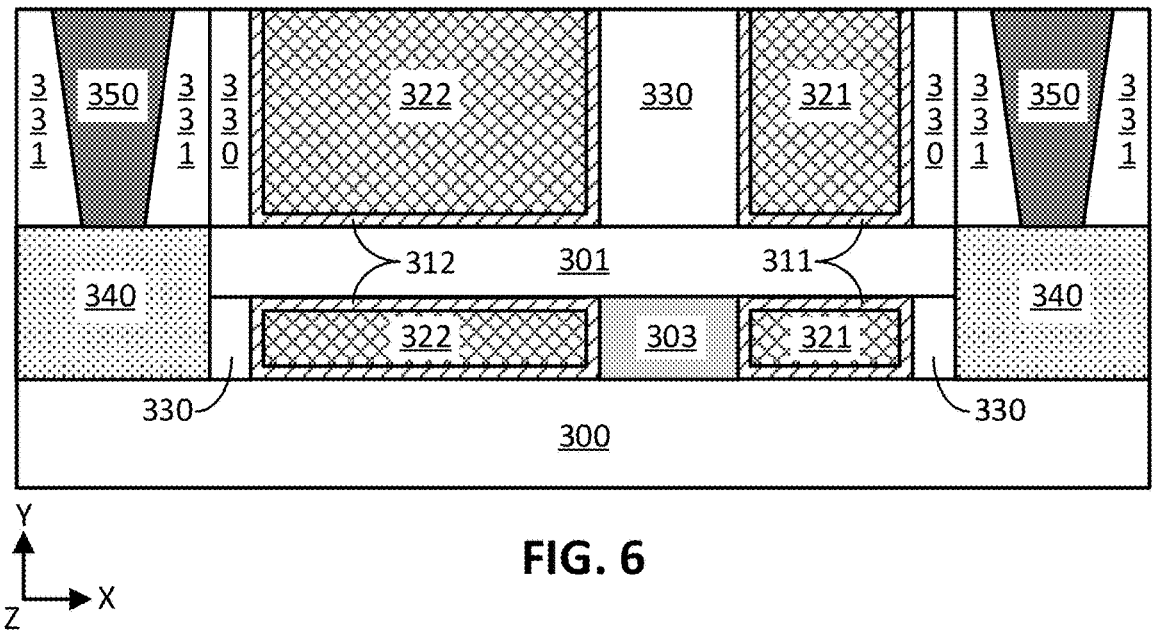
FIG. 6 illustrates a cross-sectional view of an example multi-gate DAC structure employing two gates and a gate-all-around configuration, in accordance with some embodiments.
Figure 7:
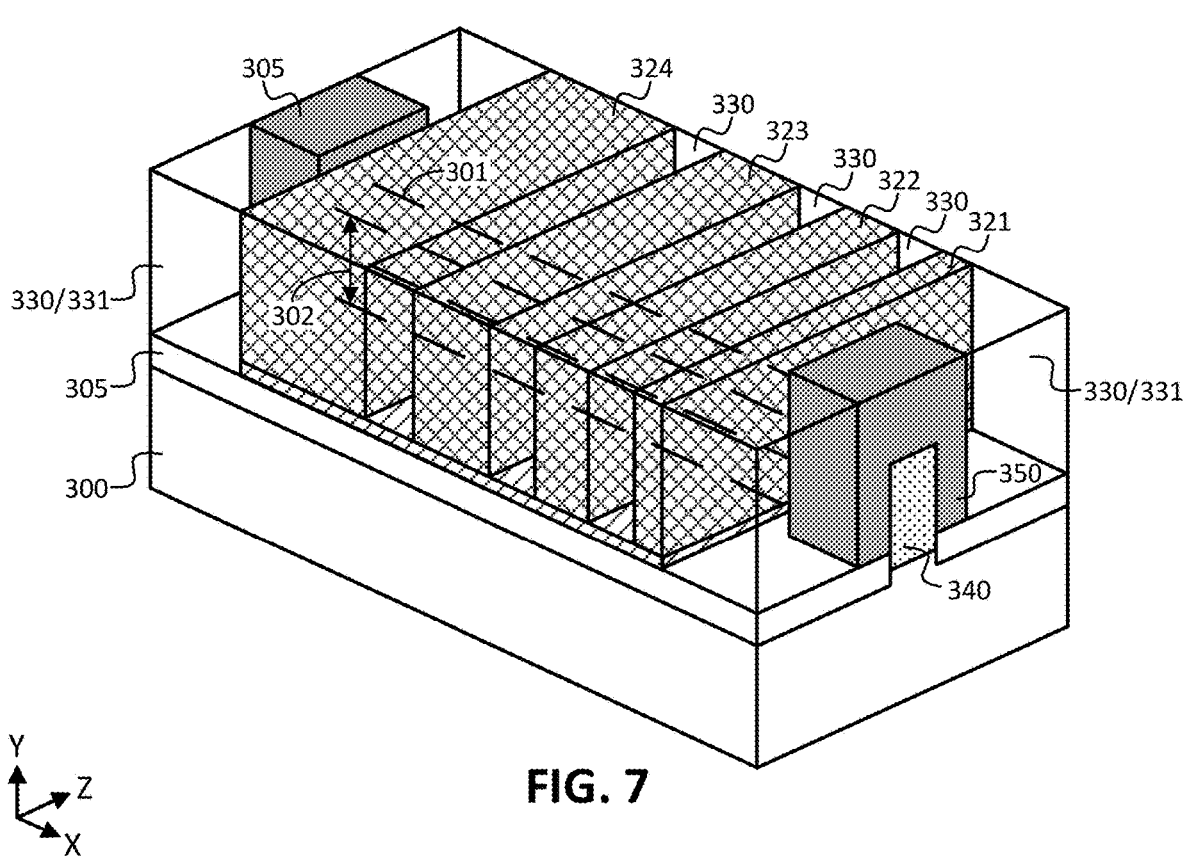
FIG. 7 illustrates a perspective view of a multi-gate DAC structure employing four gates and a finned configuration, in accordance with some embodiments.

FIGS. 6 and 7 illustrate how the multi-gate DAC structures described herein can have a non-planar configuration, in accordance with some embodiments. Planar configurations of the multi-gate DAC structures described herein relate to where the gate electrodes (e.g., 321-324) are above or otherwise adjacent to only one side of body 301. Non-planar configurations of the multi-gate DAC structures described herein relate to where the gate electrodes (e.g., 321-324) are adjacent to multiple sides of body 301. For instance, finned embodiments, such as shown in FIG. 7, include the gate electrodes (e.g., 321-324) being above body 301 and also adjacent to two sides of body 301, such that the body is between two portions of each gate electrode of the multi-gate DAC structure (similar to finFET devices). Gate-all-around embodiments, such as is shown in FIG. 6, include the gate electrodes (321 and 322, in the example structure of FIG. 6) being around or surrounding the body (301, in the example structure of FIG. 6). In some such embodiments, the body (e.g., 301) is considered a nanowire or nanoribbon, for example.

FIG. 6 illustrates a cross-sectional view of an example multi-gate DAC structure employing two gates and a gate-all-around configuration, in accordance with some embodiments. Understandably, this structure is similar to the structure of FIG. 5', except that the two gate structures wrap around body 301 in a gate-all-around (GAA) configuration. The two gate structures, in this example embodiment, include the first gate structure that includes gate dielectric 311 and gate electrode 321, and the second gate structure that includes gate dielectric 312 and gate electrode 322. In this example structure, body 301 may be considered a nanowire or nanoribbon, for example. Such a structure can be formed using an initial multilayer stack including one or more sacrificial layers (such as sacrificial layer 303) and one or more non-sacrificial layers (such as the layer that becomes body 301). The sacrificial layer(s) of the multilayer stack can then be removed via selective etch processing to release the non-sacrificial layer(s) to be used as the body(ies) of channel material. Thus, sacrificial layer 303 can be selectively etched relative to body 301 using a given etchant. Such selective etch processing can occur, for example, during process 208 where the replacement gate processing occurs. For instance, if body 301 includes germanium (e.g., Ge or SiGe), then sacrificial layer 303 may include silicon (e.g., Si or SiGe), and the germanium concentration difference between the two materials can be selected to be great enough (e.g., at least 30 atomic percent) to enable removing the material of the sacrificial layer 303 while not etching (or etching at a relatively slower rate) the material of body 301. Note that although sacrificial layer 303 is still present as shown, in other embodiments, it is completely removed, for example.

In some embodiments employing a gate-all-around or GAA configuration, the nanowire/nanoribbon-shaped body (301 in FIG. 6) has a height (in the Y-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable range as will be apparent in light of this disclosure. In some embodiments, the nanowire/nanoribbon-shaped body has a height of at least 2, 5, 8, 10, 15, 20, 25, or 50 nm, and/or a height of at most 100, 75, 50, 40, 30, 25, 20, 15, 12, or 10 nm, for example. Although only one body (or nanowire or nanoribbon) is shown in the example structure of FIG. 6, any number of bodies (or nanowires or nanoribbons) can be employed in a gate-all-around configuration, such as 2-10 or more, in accordance with some embodiments.

FIG. 7 illustrates a perspective view of a multi-gate DAC structure employing four gates and a finned configuration, in accordance with some embodiments. Note that the structure of FIG. 7 is similar to the structure of FIG. 3E, with minor variations for ease of illustration. Also note that the dielectric layer 330 and additional dielectric layer 331 in FIG. 7 are not differentiated with a distinct interface and those layers 330/331 are also shown as transparent to allow the underlying features to be seen. In this example structure, it is shown that the multi-gate DAC structure includes body 301 that is a fin (or has a fin-like shape or configuration) and is shown using dashed lines (as the fin is under the gate structures, in this view). In addition, the fin has an active height 302 that is indicated in FIG. 7 and is the height of the fin that is between portions of each of the gate structures (e.g., between portions of each of gate electrodes 321-324, in this example case). In other words, height 302 relates to the height of the portion of the fin that extends above the top plane of the isolation regions 305 (which may be referred to as shallow trench isolation (STI) regions, in some cases). Note that structures of FIGS. 3E, 3E', 4, 4', 5, and 5' are equally applicable to non-planar configurations as they are planar configurations. For instance, if the structures in those figures were to be finned configurations, body 301 would also have an active fin height 302, as shown in those figures, where each gate electrode would be adjacent to at least two sides of body 301 in the Z-axis direction (behind and in front of the cross-sectional view shown), for example. Accordingly, a dashed line is provided to indicate the bottom of the gate structure (e.g., the bottom surface of the gate dielectrics), in such cases.

In some embodiments employing a finned configuration (e.g., where the body is a fin), the fins can be formed using any suitable techniques, such as blanket depositing the body of channel material and patterning the blanket-deposited layer into fins as desired. Another technique includes forming fins in the top of a substrate (such as substrate 300), forming isolation regions including dielectric material in the trenches between fins, recessing or removing the substrate-based fins to make trenches between the isolation regions, depositing the material of body 301 to form fins in those trenches, and then recessing the isolation regions to allow the fins to expose the fins and allow them to protrude or extend above a top surface of the isolation regions. For instance, isolation regions 305 would be those recessed isolation regions in such cases. Regardless, in some embodiments, isolation regions (or STI regions) 305 include dielectric material. In some such embodiments, the dielectric material included in isolation regions 305 includes any suitable oxide (e.g., silicon dioxide), nitride (e.g., silicon nitride), high-k dielectric, low-k dielectric, and/or any other suitable electrically insulating material as will be apparent in light of this disclosure. In some embodiments, isolation regions 305 include silicon, oxygen, nitrogen, and/or carbon. For instance, in some embodiments, isolation regions 305 includes silicon dioxide, silicon nitride, silicon oxynitride, or carbon-doped silicon dioxide (or other carbon-doped oxides).

In some embodiments employing a finned configuration, the fin-shaped body has a width (dimension in the Z-axis direction) in the range of 2-100 nm (or in a subrange of 2-10, 2-25, 2-40, 2-50, 2-75, 4-10, 4-25, 4-40, 4-50, 4-75, 4-100, 10-25, 10-40, 10-50, 10-75, 10-100, 25-40, 25-50, 25-75, 25-100, or 50-100 nm) or greater, or any other suitable range as will be apparent in light of this disclosure. In some embodiments, the fin-shaped body has a width of at least 2, 5, 8, 10, 15, 20, 25, or 50 nm, and/or a width of at most 100, 75, 50, 40, 30, 25, 20, 15, 12, or 10 nm, for example. In some embodiments employing a finned configuration, the active height 302 of the fin-shaped body is a height (dimension in the Y-axis direction) in the range of 5-200 nm (or in a subrange of 5-25, 5-50, 5-100, 10-25, 10-50, 10-80, 10-100, 10-200, 20-80, 20-100, 20-200, 40-80, 40-120, 40-200, 50-100, 50-200, or 100-200 nm) or greater, or any other suitable range as will be apparent in light of this disclosure. In some embodiments, the fin-shaped body has an active height 302 of at least 5, 10, 15, 20, 25, 50, 80, 100, 120, or 150 nm, and/or at most 200, 150, 120, 100, 80, 50, or 25 nm, for example. In some embodiments employing a finned configuration, the active height 302 to width ratio of the fins is greater than 1, such as greater than 1.5, 2, 2.5, 3, 4, 5, 6, 7, 8, 9, or 10, or greater than any other suitable threshold ratio.

Although the multi-gate transistor-like structures are primarily described herein in the context of DAC applications (e.g., as multi-gate DAC structures), the present disclosure is not intended to be so limited. For instance, in some embodiments, the multi-gate transistor-like structures can be used for logic and/or memory applications (e.g., in logic and/or memory devices). Numerous variations and configurations will be apparent in light of this disclosure.

Example System

Figure 8:
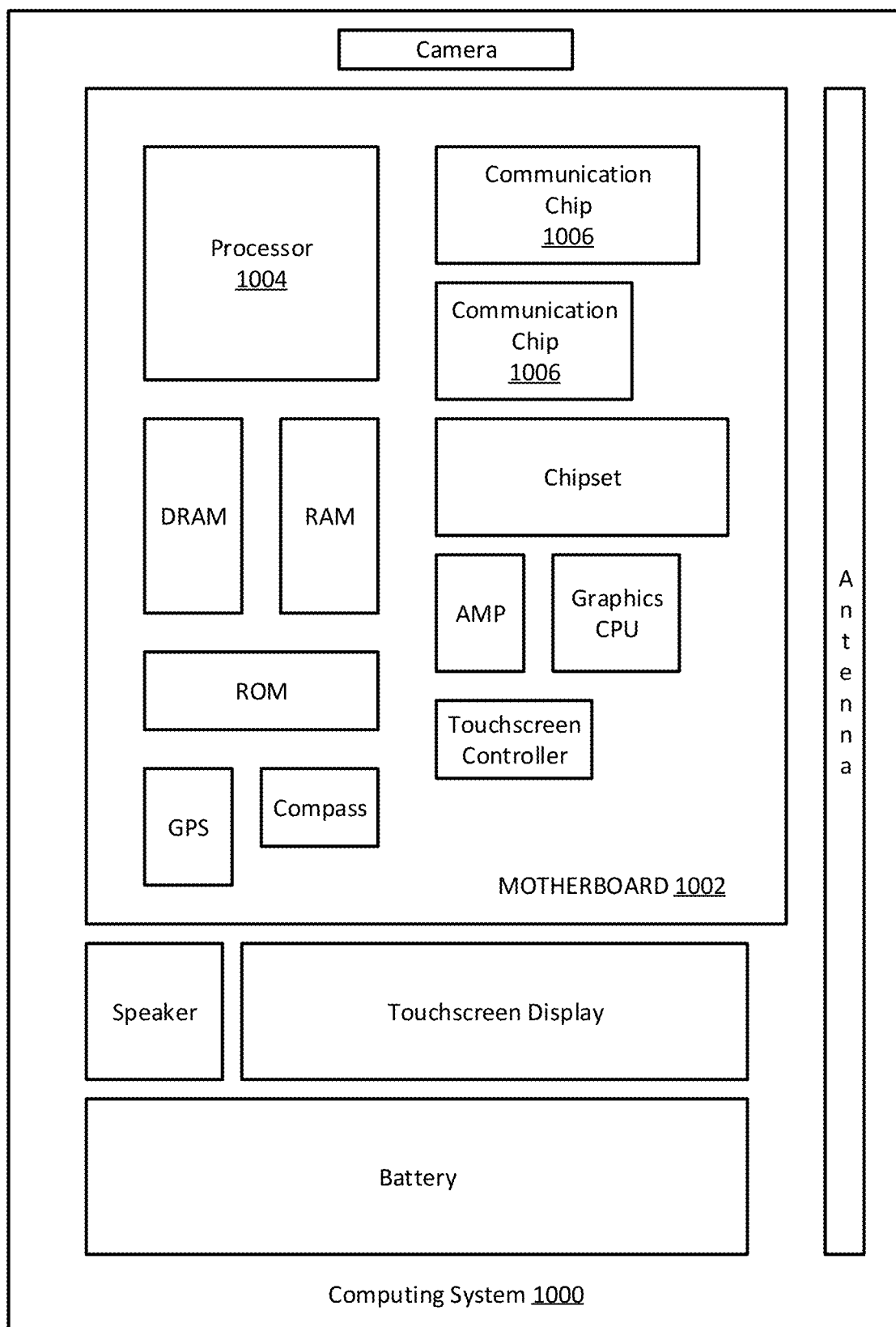
FIG. 8 illustrates a computing system implemented with integrated circuit and/or multi-gate DAC structures disclosed herein, in accordance with some embodiments.

FIG. 8 illustrates a computing system 1000 implemented with integrated circuit and/or multi-gate DAC structures disclosed herein, in accordance with some embodiments. For example, the multi-gate DAC structures disclosed herein can be included in one or more portions of computing system 1000. As can be seen, the computing system 1000 houses a motherboard 1002. The motherboard 1002 can include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 can include one or more other components that may or may not be physically and electrically coupled to the motherboard 1002. These other components can include, but are not limited to, volatile memory (e.g., DRAM or other types of RAM), non-volatile memory (e.g., ROM, ReRAM/RRAM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 can include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 can implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 can include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also can include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability can be integrated directly into the processor 1004 (e.g., where functionality of any chips 1006 is integrated into processor 1004, rather than having separate communication chips). Further note that processor 1004 can be a chip set having such wireless capability. In short, any number of processor 1004 and/or communication chips 1006 can be used. Likewise, any one chip or chip set can have multiple functions integrated therein.

In various implementations, the computing system 1000 can be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is an integrated circuit including a body (or channel region), a source (or first) region, a drain (or second) region, a first gate electrode (or first gate), and a second gate electrode (or second gate). The body includes semiconductor material. The source and drain regions are adjacent to the body and/or the body is between the source and drain regions. The source and drain regions include semiconductor material. The first and second gate electrodes include one or more metals. The first and second gate electrodes are at least above and/or over the body. Note that the semiconductor material of the body may be the same as the semiconductor material of the source and drain regions (not counting doping) according to some embodiments, while in other embodiments the semiconductor material of the body is compositionally different from the semiconductor material of the source and drain regions (not counting doping).

Example 2 includes the subject matter of Example 1, wherein the second gate electrode is within 20, 10, or 5 nm of the first gate electrode.

Example 3 includes the subject matter of Example 1 or 2, wherein the semiconductor material included in the body includes group IV and/or group III-V semiconductor material.

Example 4 includes the subject matter of any of Examples 1-3, wherein the semiconductor material included in the body includes indium.

Example 5 includes the subject matter of any of Examples 1-4, wherein the semiconductor material included in the body includes gallium.

Example 6 includes the subject matter of any of Examples 1-5, wherein the semiconductor material included in the body includes one of arsenic, phosphorous, or antimony.

Example 7 includes the subject matter of any of Examples 1-3, wherein the semiconductor material included in the body includes germanium.

Example 8 includes the subject matter of Example 7, wherein the semiconductor material included in the body further includes silicon.

Example 9 includes the subject matter of any of Examples 1-8, wherein the first gate electrode has a first width and the second gate electrode has a second width, the second width at least 2, 3, or 5 nm greater than the first width.

Example 10 includes the subject matter of any of Examples 1-9, wherein the first gate electrode has a first width and the second gate electrode has a second width, the second width within 5, 3, or 2 nm of double the first width.

Example 11 includes the subject matter of any of Examples 1-10, wherein the first gate electrode has a width of at least 10, 15, or 20 nm.

Example 12 includes the subject matter of any of Examples 1-11, wherein the first gate electrode has a width of at most 10, 15, or 20 nm.

Example 13 includes the subject matter of any of Examples 1-12, further including a third gate electrode at least above the body, the third gate electrode including one or more metals, wherein the third gate electrode is within 20, 10, or 5 nm of the second gate electrode.

Example 14 includes the subject matter of any of Examples 1-13, wherein only dielectric material is between the first and second gate electrodes.

Example 15 includes the subject matter of any of Examples 1-14, further including a gate dielectric including one or more dielectrics, the gate dielectric between the first gate electrode and the body at a first location, the gate dielectric between the second gate electrode and the body at a second location.

Example 16 includes the subject matter of Example 15, wherein the gate dielectric is a single continual structure that continually extends from the first location to the second location.

Example 17 includes the subject matter of any of Examples 1-14, further including: a first gate dielectric including one or more dielectrics, the first gate dielectric between the first gate electrode and the body, the first gate electrode between two portions of the first gate dielectric; and a second gate dielectric including one or more dielectrics, the second gate dielectric between the second gate electrode and the body, the second gate electrode between two portions of the second gate dielectric.

Example 18 includes the subject matter of any of Examples 1-17, wherein the body is monolithic between the source and drain regions, such that there are no other regions that include compositionally different material within the body between the source and drain regions.

Example 19 includes the subject matter of any of Examples 1-18, further including a digital-to-analog converter (DAC), wherein the first gate electrode is electrically connected to a first bit of the DAC and the second gate electrode is electrically connected to a second bit of the DAC.

Example 20 is a computing system including the subject matter of any of Examples 1-19.

Example 21 is an integrated circuit including: a body including semiconductor material; a source region and a drain region, the source and drain regions adjacent the body, the source and drain regions including semiconductor material; a first gate structure at least above the body, the first gate structure including a first gate electrode and a first gate dielectric, the first gate dielectric between the first gate electrode and the body, the first gate electrode having a width and including one or more metals, the first gate dielectric including one or more dielectrics; and a second gate structure at least above the body, the second gate structure including a second gate electrode and a second gate dielectric, the second gate dielectric between the second gate electrode and the body, the second gate electrode having a width and including one or more metals, the second gate dielectric including one or more dielectrics.

Example 21 includes the subject matter of Example 21, wherein the second gate electrode is within 20, 10, or 5 nm of the first gate electrode.

Example 23 includes the subject matter of Example 21 or 22, wherein the semiconductor material included in the body includes group IV and/or group III-V semiconductor material.

Example 24 includes the subject matter of any of Examples 21-23, wherein the semiconductor material included in the body includes indium.

Example 25 includes the subject matter of any of Examples 21-24, wherein the semiconductor material included in the body includes gallium.

Example 26 includes the subject matter of any of Examples 21-25, wherein the semiconductor material included in the body includes one of arsenic, phosphorous, or antimony.

Example 27 includes the subject matter of any of Examples 21-23, wherein the semiconductor material included in the body includes germanium.

Example 28 includes the subject matter of Example 27, wherein the semiconductor material included in the body further includes silicon.

Example 29 includes the subject matter of any of Examples 21-28, wherein the first gate electrode has a first width and the second gate electrode has a second width, the second width at least 2, 3, or 5 nm greater than the first width.

Example 30 includes the subject matter of any of Examples 21-29, wherein the first gate electrode has a first width and the second gate electrode has a second width, the second width within 5, 3, or 2 nm of double the first width.

Example 31 includes the subject matter of any of Examples 21-30, wherein the first gate electrode has a width of at least 10, 15, or 20 nm.

Example 32 includes the subject matter of any of Examples 21-31, wherein the first gate electrode has a width of at most 10, 15, or 20 nm.

Example 33 includes the subject matter of any of Examples 21-32, further including: a third gate structure at least above the body, the third gate structure including a third gate electrode and a third gate dielectric, the third gate dielectric between the third gate electrode and the body, the third gate electrode having a width and including one or more metals, the third gate dielectric including one or more dielectrics, wherein the third gate electrode width is within 5, 3, or 2 nm of double the second gate electrode width; and a fourth gate structure at least above the body, the fourth gate structure including a fourth gate electrode and a fourth gate dielectric, the fourth gate dielectric between the fourth gate electrode and the body, the fourth gate electrode having a width and including one or more metals, the fourth gate dielectric including one or more dielectrics, wherein the fourth gate electrode width is within 5, 3, or 2 nm of double the third gate electrode width; wherein the second gate structure is between the first and third gate structures, and the third gate structure is between the second and fourth gate structures.

Example 34 includes the subject matter of Example 33, wherein the first gate dielectric, second gate dielectric, third gate dielectric, and fourth gate dielectric are all portions of a single gate dielectric structure, such that the single gate dielectric structure continually extends from between the first gate electrode and the body to between the fourth gate electrode and the body.

Example 35 includes the subject matter of any of Examples 21-34, wherein only dielectric material is between the first and second gate electrodes.

Example 36 includes the subject matter of Example 35, wherein the dielectric material between the first and second gate electrodes includes a portion of the first gate dielectric and a portion of the second gate dielectric.

Example 37 includes the subject matter of any of Examples 21-33 or 35, wherein the first and second gate dielectrics are distinct structures.

Example 38 includes the subject matter of any of Examples 21-37, wherein the body is monolithic between the source and drain regions, such that there are no other regions that include compositionally different material within the body between the source and drain regions.

Example 39 includes the subject matter of any of Examples 21-38, further including a digital-to-analog converter (DAC), wherein the first gate electrode is electrically connected to a first bit of the DAC and the second gate electrode is electrically connected to a second bit of the DAC.

Example 40 is a computing system including the subject matter of any of Examples 21-39.

Example 41 is a method of forming the subject matter of any of Examples 1-40. The method includes at least providing the body, forming the source and drain regions, forming the first gate electrode, and forming the second gate electrode.

Example 42 includes the subject matter of Example 41, wherein the first and second gate electrodes are formed by removing dummy gate structures and replacing them with the first and second gate electrodes.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising:
a body including semiconductor material;
a source region and a drain region, the body between the source and drain regions, the source and drain regions including semiconductor material;
a first gate electrode at least above the body, the first gate electrode including one or more metals;
a second gate electrode at least above the body and laterally adjacent to the first gate electrode, the second gate electrode including one or more metals, the second gate electrode distinct from the first gate electrode, the second gate electrode within 20 nanometers (nm) of the first gate electrode, and the second gate electrode having a second width less than a first width of the first gate electrode; and
a third gate electrode at least above the body and laterally adjacent to the second gate electrode, the third gate electrode including one or more metals, and the third gate electrode having a third width less than the second width of the second gate electrode.

2. The integrated circuit of claim 1, wherein the semiconductor material included in the body includes indium.

3. The integrated circuit of claim 1, wherein the semiconductor material included in the body includes gallium.

4. The integrated circuit of claim 1, wherein the semiconductor material included in the body includes one of arsenic, phosphorous, or antimony.

5. The integrated circuit of claim 1, wherein the semiconductor material included in the body includes germanium.

6. The integrated circuit of claim 5, wherein the semiconductor material included in the body further includes silicon.

7. The integrated circuit of claim 1, wherein the first width is at least 2 nm greater than the second width.

8. The integrated circuit of claim 1, wherein the first width is within 2 nm of double the second width.

9. The integrated circuit of claim 1, wherein the first second gate electrode has the second width of at least 10 nm.

10. The integrated circuit of claim 1, wherein the third gate electrode is within 20 nm of the second gate electrode.

11. The integrated circuit of claim 1, wherein only dielectric material is between the first and second gate electrodes.

12. The integrated circuit of claim 1, further comprising a gate dielectric including one or more dielectrics, the gate dielectric between the first gate electrode and the body at a first location, the gate dielectric between the second gate electrode and the body at a second location, wherein the gate dielectric is a single continual structure that continually extends from the first location to the second location.

13. The integrated circuit of claim 1, further comprising:
a first gate dielectric including one or more dielectrics, the first gate dielectric between the first gate electrode and the body, the first gate electrode between two portions of the first gate dielectric; and
a second gate dielectric including one or more dielectrics, the first dielectric between the second gate electrode and the body, the second gate electrode between two portions of the second gate dielectric.

14. The integrated circuit of claim 1, wherein the body is monolithic between the source and drain regions, such that there are no other regions that include compositionally different material within the body between the source and drain regions.

15. The integrated circuit of claim 1, further comprising a digital-to-analog converter (DAC), wherein the first gate electrode is electrically connected to a first bit of the DAC and the second gate electrode is electrically connected to a second bit of the DAC.

16. An integrated circuit comprising:
a body including semiconductor material;
a source region and a drain region, the source and drain regions adjacent the body, the source and drain regions including semiconductor material;
a first gate structure at least above the body, the first gate structure including a first gate electrode and a first gate dielectric, the first gate dielectric between the first gate electrode and the body, the first gate electrode having a first width and including one or more metals, the first gate dielectric including one or more dielectrics;
a second gate structure at least above the body, the second gate structure including a second gate electrode and a second gate dielectric, the second gate dielectric between the second gate electrode and the body, the second gate electrode having a second width and including one or more metals, the second gate dielectric including one or more dielectrics, wherein the first width is within 3 nanometers (nm) of double the second width; and
a third gate structure at least above the body and laterally adjacent to the second gate structure, the third gate structure including a third gate electrode and a third gate dielectric, and the third gate electrode having a third width less than the second width of the second gate electrode.

17. The integrated circuit of claim 16, further comprising:
a third gate structure at least above the body, the third gate structure including a third gate electrode and a third gate dielectric, the third gate dielectric between the third gate electrode and the body, the third gate electrode having a width and including one or more metals, the third gate dielectric including one or more dielectrics, wherein the third gate electrode width is within 3 nm of double the second gate electrode width; and
a fourth gate structure at least above the body, the fourth gate structure including a fourth gate electrode and a fourth gate dielectric, the fourth gate dielectric between the fourth gate electrode and the body, the fourth gate electrode having a width and including one or more metals, the fourth dielectric including one or more dielectrics, wherein the fourth gate electrode width is within 3 nm of double the third gate electrode width; wherein the second gate structure is between the first and third gate structures, and the third gate structure is between the second and fourth gate structures.

18. The integrated circuit of claim 17, wherein the first gate dielectric, second gate dielectric, third gate dielectric, and fourth gate dielectric are all portions of a single gate dielectric structure, such that the single gate dielectric structure continually extends from between the first gate electrode and the body to between the fourth gate electrode and the body.

19. A method of forming an integrated circuit, the method comprising:
providing a body including semiconductor material;
forming a source region and a drain region, the body between the source and drain regions, the source and drain regions including semiconductor material and dopant;
forming a first gate electrode at least above the body, the first gate electrode including one or more metals;
forming a second gate electrode at least above the body and laterally adjacent to the first gate electrode, the second gate electrode including one or more metals, the second gate electrode distinct from the first gate electrode, the second gate electrode within 20 nanometers (nm) of the first gate electrode, and the second gate electrode having a second width less than a first width of the first gate electrode; and
forming a third gate electrode at least above the body and laterally adjacent to the second gate electrode, the third gate electrode including one or more metals, and the third gate electrode having a third width less than the second width of the second gate electrode.

20. The method of claim 19, wherein the first and second gate electrodes are formed by removing dummy gate structures and replacing them with the first and second gate electrodes.

* * * * *